(12) United States Patent
Chuang et al.

(10) Patent No.: US 12,369,307 B2
(45) Date of Patent: Jul. 22, 2025

(54) ACCESS TRANSISTORS IN A DUAL GATE LINE CONFIGURATION AND METHODS FOR FORMING THE SAME

(71) Applicant: Taiwan Semiconductor Manufacturing Company Limited, Hsinchu (TW)

(72) Inventors: Ming-Yen Chuang, Hsinchu (TW); Chia Ling, Hsinchu (TW); Katherine H. Chiang, New Taipei (TW); Chung-Te Lin, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 590 days.

(21) Appl. No.: 17/483,900

(22) Filed: Sep. 24, 2021

(65) Prior Publication Data
US 2022/0359524 A1    Nov. 10, 2022

Related U.S. Application Data

(60) Provisional application No. 63/186,382, filed on May 10, 2021.

(51) Int. Cl.
*H10B 12/00*    (2023.01)
*H01L 21/02*    (2006.01)
(Continued)

(52) U.S. Cl.
CPC ..... *H10B 12/315* (2023.02); *H01L 21/02565* (2013.01); *H10B 12/0335* (2023.02);
(Continued)

(58) Field of Classification Search
CPC ..... H01L 28/90; H10B 12/488; H10B 12/315; H10D 1/716
See application file for complete search history.

(56) References Cited

U.S. PATENT DOCUMENTS

| 6,066,869 A | 5/2000 | Noble et al. |
| 6,281,552 B1 * | 8/2001 | Kawasaki ......... H01L 29/78645 |
| | | 257/E21.414 |

(Continued)

FOREIGN PATENT DOCUMENTS

| DE | 102013102720 A1 | 10/2013 |
| KR | 100295568 | 9/2001 |

OTHER PUBLICATIONS

German Patent and Trademark Office, Application No. 10 2022 100 618.2, Examination Report mailed Jan. 19, 2023, 6 pages.
(Continued)

*Primary Examiner* — Incent Wall
(74) *Attorney, Agent, or Firm* — The Marbury Law Group, PLLC

(57) ABSTRACT

A semiconductor structure includes a two-dimensional array of unit cell structures overlying a substrate. Each unit cell structure includes an active layer, a gate dielectric underlying the active layer, two gate electrodes underlying the gate dielectric, and two source electrodes and a drain electrode overlying the active layer. Word lines underlie the active layers. Each unit cell structure includes portions of a respective set of four word lines, which includes two word lines that are electrically connected to two electrodes in the unit cell structure and two additional word lines that are electrically isolated from the two electrodes in the unit cell structure.

20 Claims, 43 Drawing Sheets

(51) Int. Cl.
*H10D 1/68* (2025.01)
*H10D 30/67* (2025.01)
*H10D 99/00* (2025.01)

(52) U.S. Cl.
CPC ........... *H10B 12/05* (2023.02); *H10B 12/488* (2023.02); *H10D 1/716* (2025.01); *H10D 30/6729* (2025.01); *H10D 30/673* (2025.01); *H10D 30/6755* (2025.01); *H10D 99/00* (2025.01)

(56) References Cited

U.S. PATENT DOCUMENTS

| | | | | |
|---|---|---|---|---|
| 6,710,409 | B1* | 3/2004 | Vyvoda | H10D 30/681 |
| | | | | 257/E29.302 |
| 2001/0026125 | A1* | 10/2001 | Yamazaki | H10K 59/131 |
| | | | | 313/506 |
| 2001/0044205 | A1* | 11/2001 | Gilbert | H01L 21/76834 |
| | | | | 438/653 |
| 2002/0006674 | A1* | 1/2002 | Ma | H01L 21/32136 |
| | | | | 257/E21.582 |
| 2005/0205910 | A1* | 9/2005 | Kumura | H10B 53/30 |
| | | | | 257/295 |
| 2010/0176395 | A1* | 7/2010 | Choi | H10D 86/00 |
| | | | | 257/E29.1 |
| 2010/0176486 | A1* | 7/2010 | Miyajima | H01L 28/91 |
| | | | | 257/532 |
| 2013/0256769 | A1* | 10/2013 | Jeong | H10B 12/31 |
| | | | | 257/296 |
| 2017/0170333 | A1* | 6/2017 | Matsumoto | H01L 29/7869 |
| 2019/0081178 | A1 | 3/2019 | Wang et al. | |
| 2021/0375991 | A1* | 12/2021 | Ho | H10B 63/84 |
| 2021/0408117 | A1* | 12/2021 | Wu | H01L 21/02565 |
| 2022/0293605 | A1* | 9/2022 | Chiang | H10D 30/6755 |
| 2022/0359524 | A1* | 11/2022 | Chuang | H10D 1/716 |
| 2023/0180460 | A1* | 6/2023 | Liu | H10B 12/0385 |
| | | | | 257/295 |
| 2023/0240066 | A1* | 7/2023 | Yeong | H10B 12/05 |

OTHER PUBLICATIONS

German Patent and Trademark Office, Application No. 10 2022 100 618.2, Examination Report mailed Jan. 19, 2023, with translation, 16 pages.

Patent and Trademark Office; KR Application No. 10-2022-0029876; Office Action mailed Jul. 12, 2024; 18 pages.

* cited by examiner

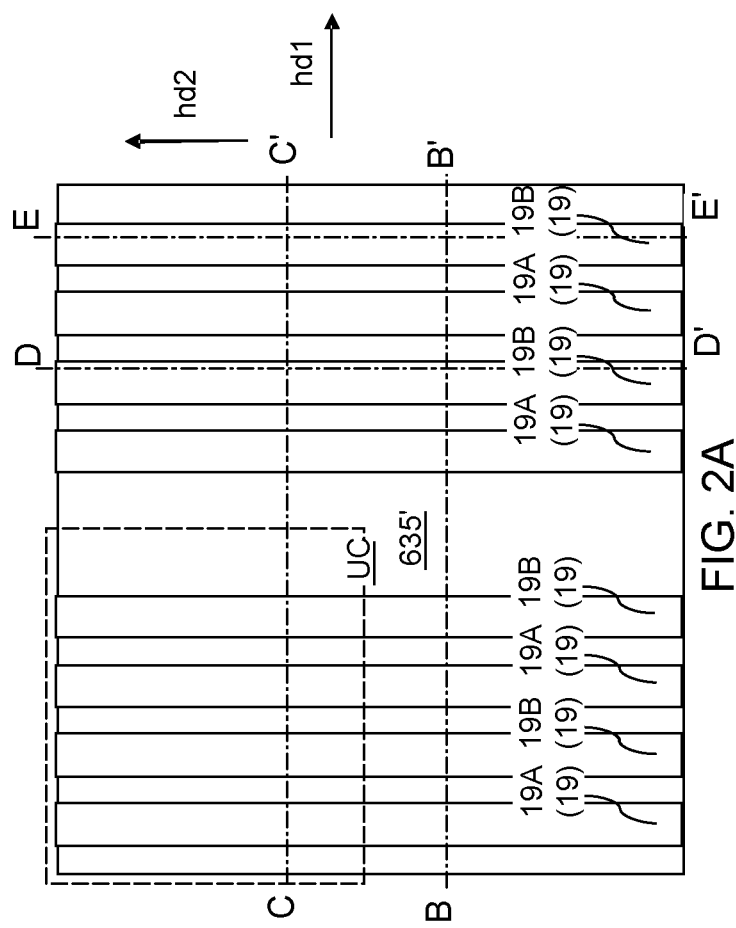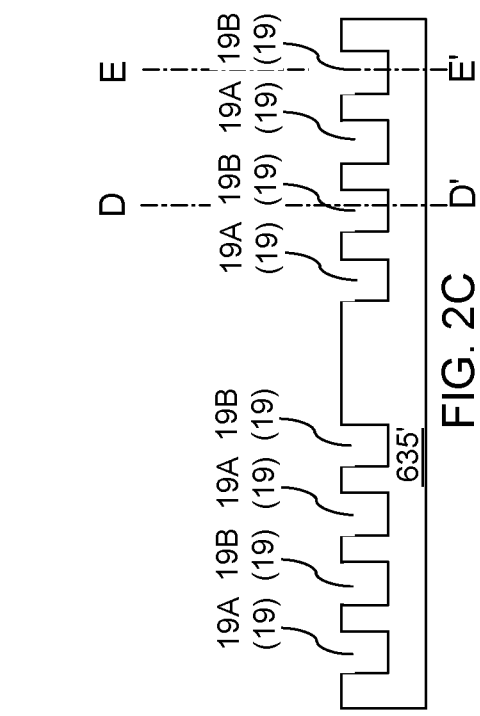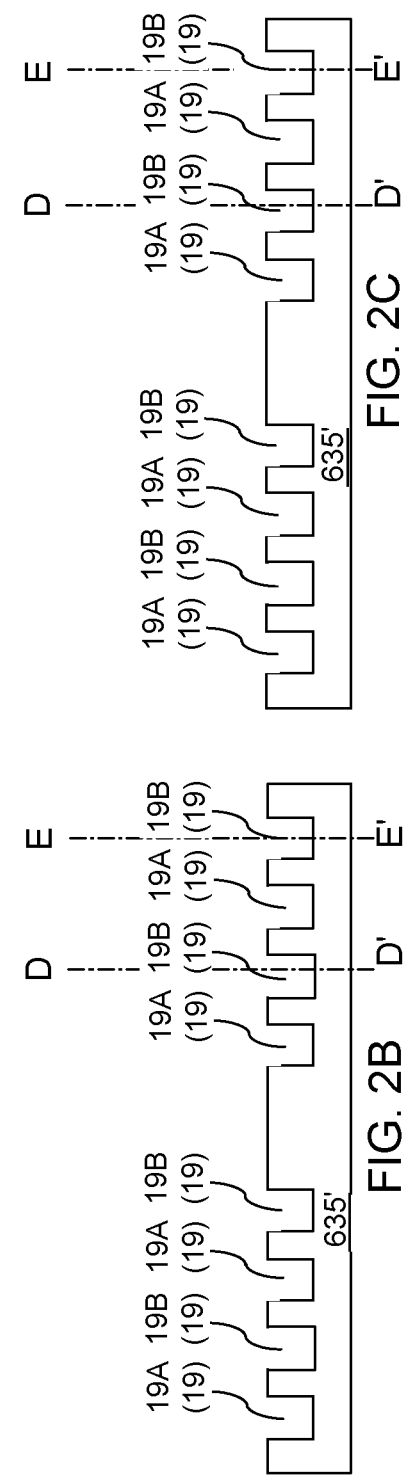

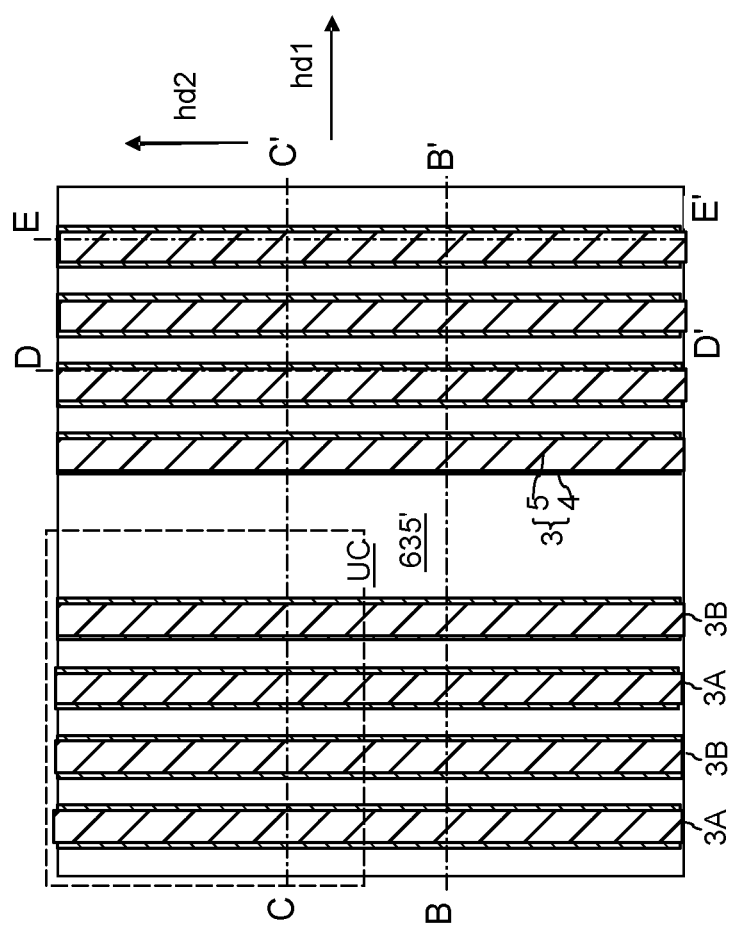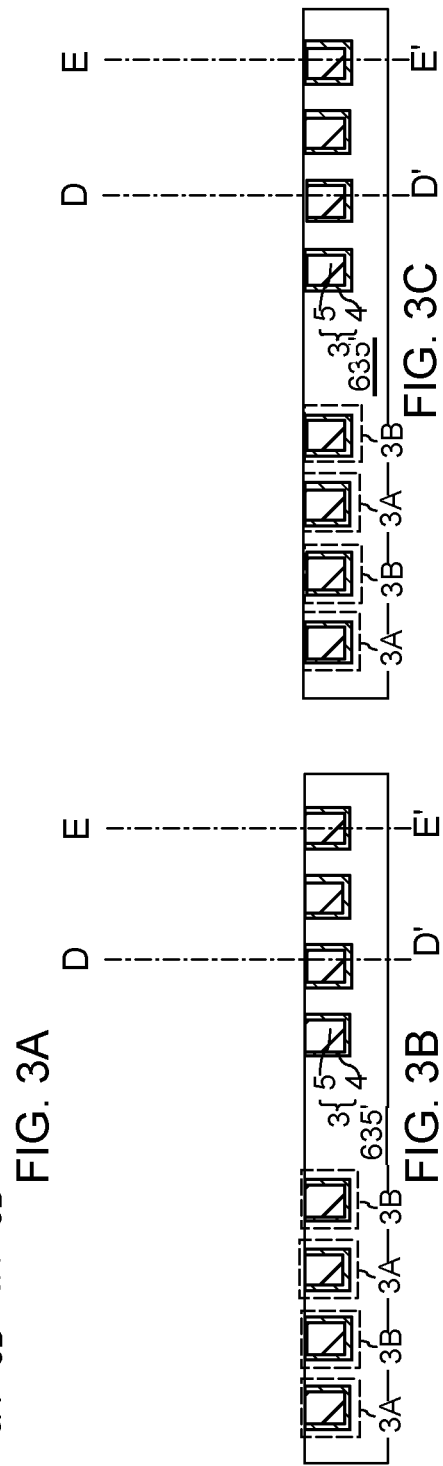
FIG. 3A
FIG. 3B
FIG. 3C

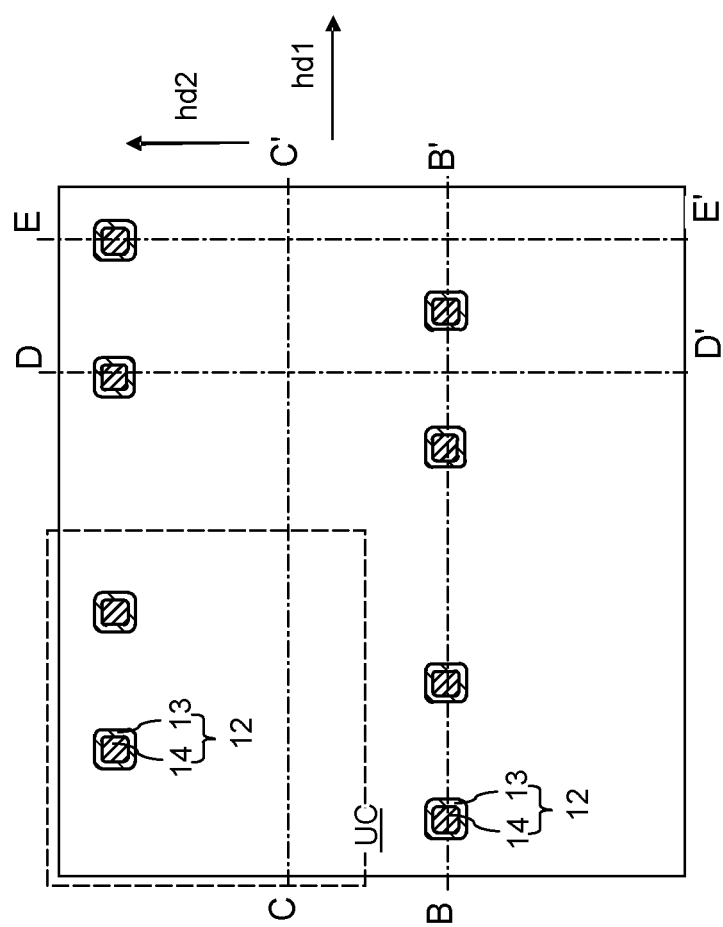
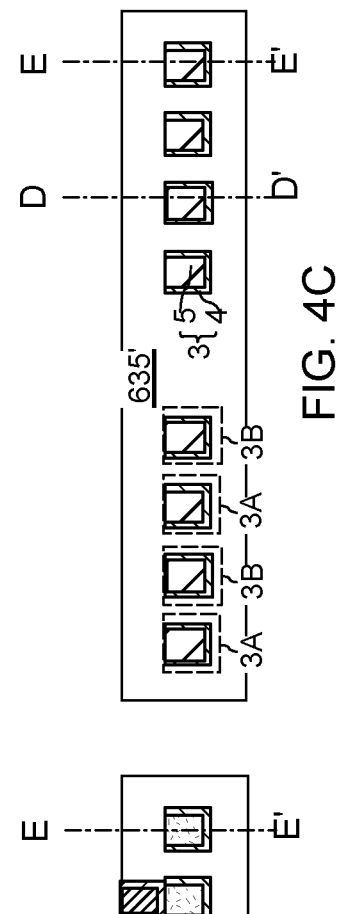
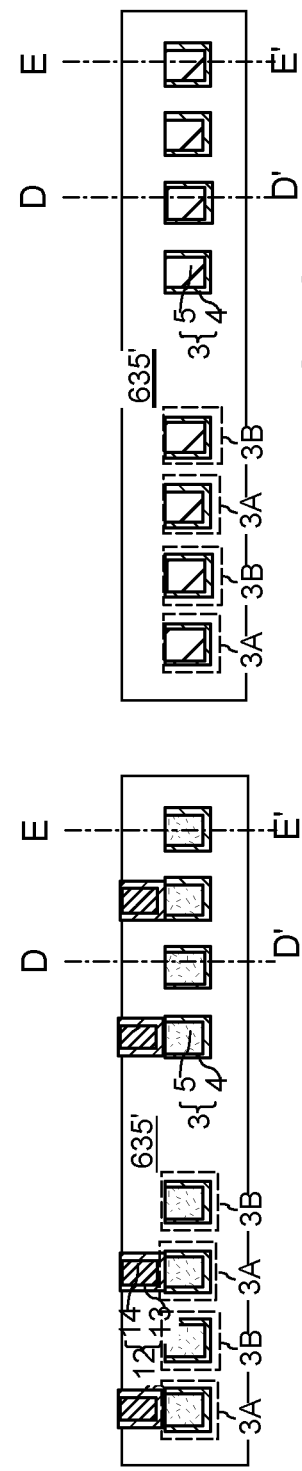
FIG. 4A
FIG. 4B
FIG. 4C

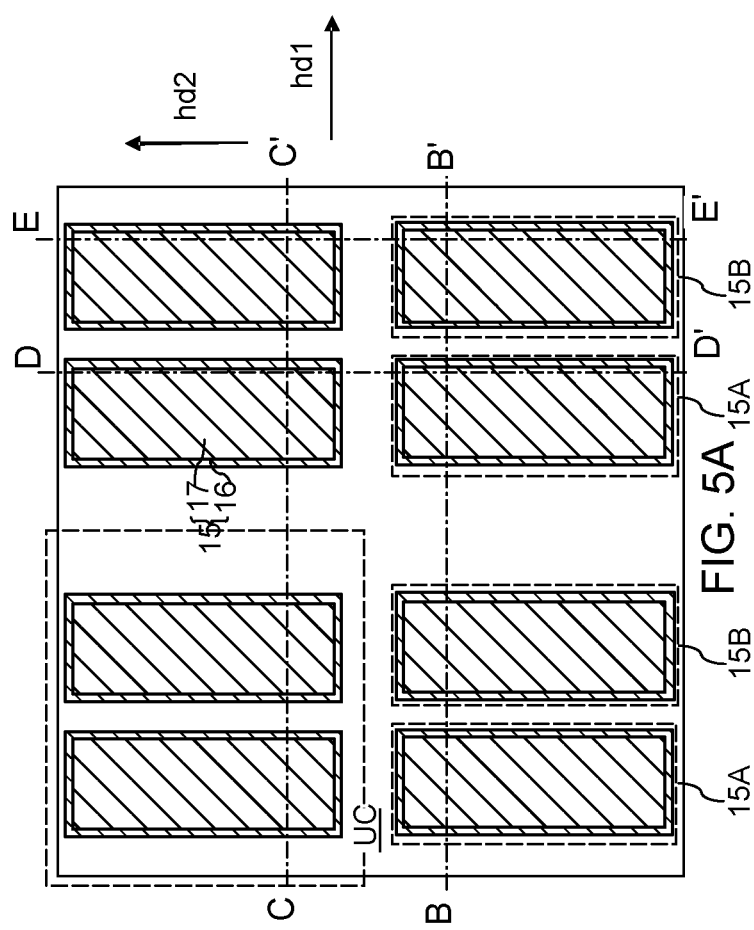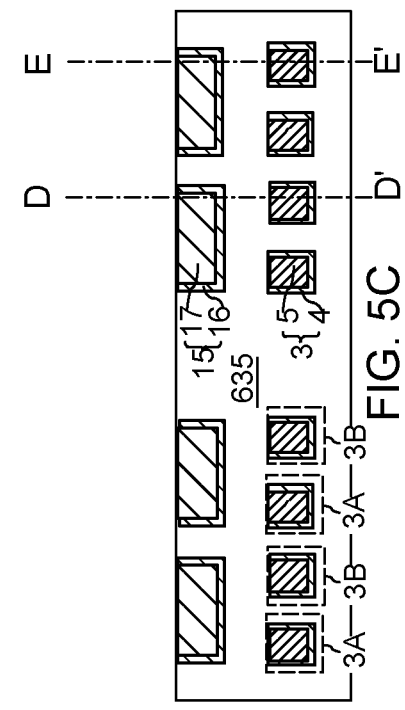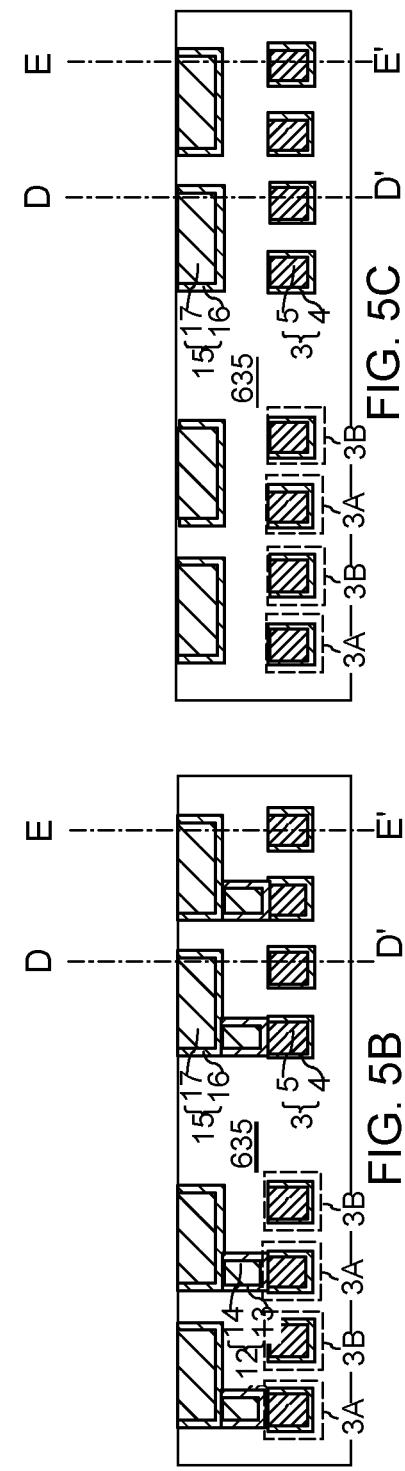

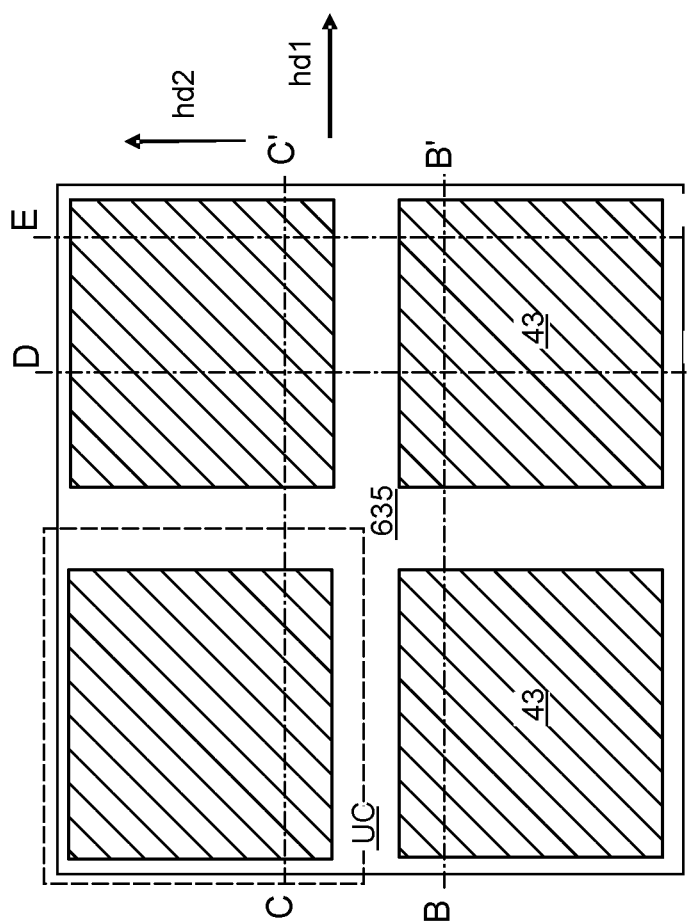
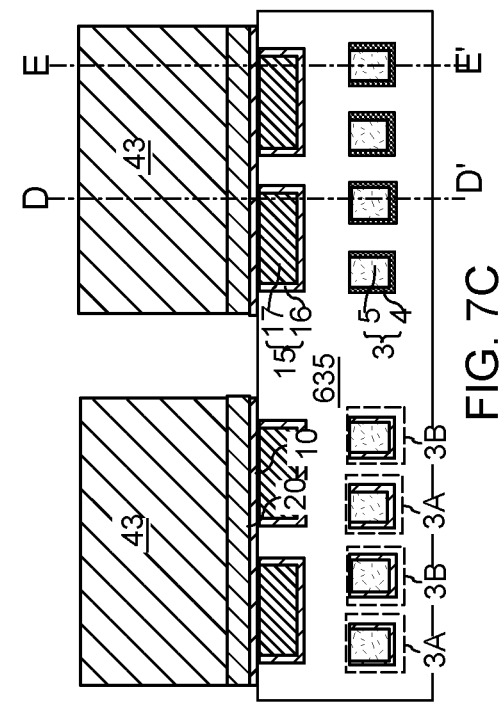
FIG. 7A
FIG. 7B
FIG. 7C

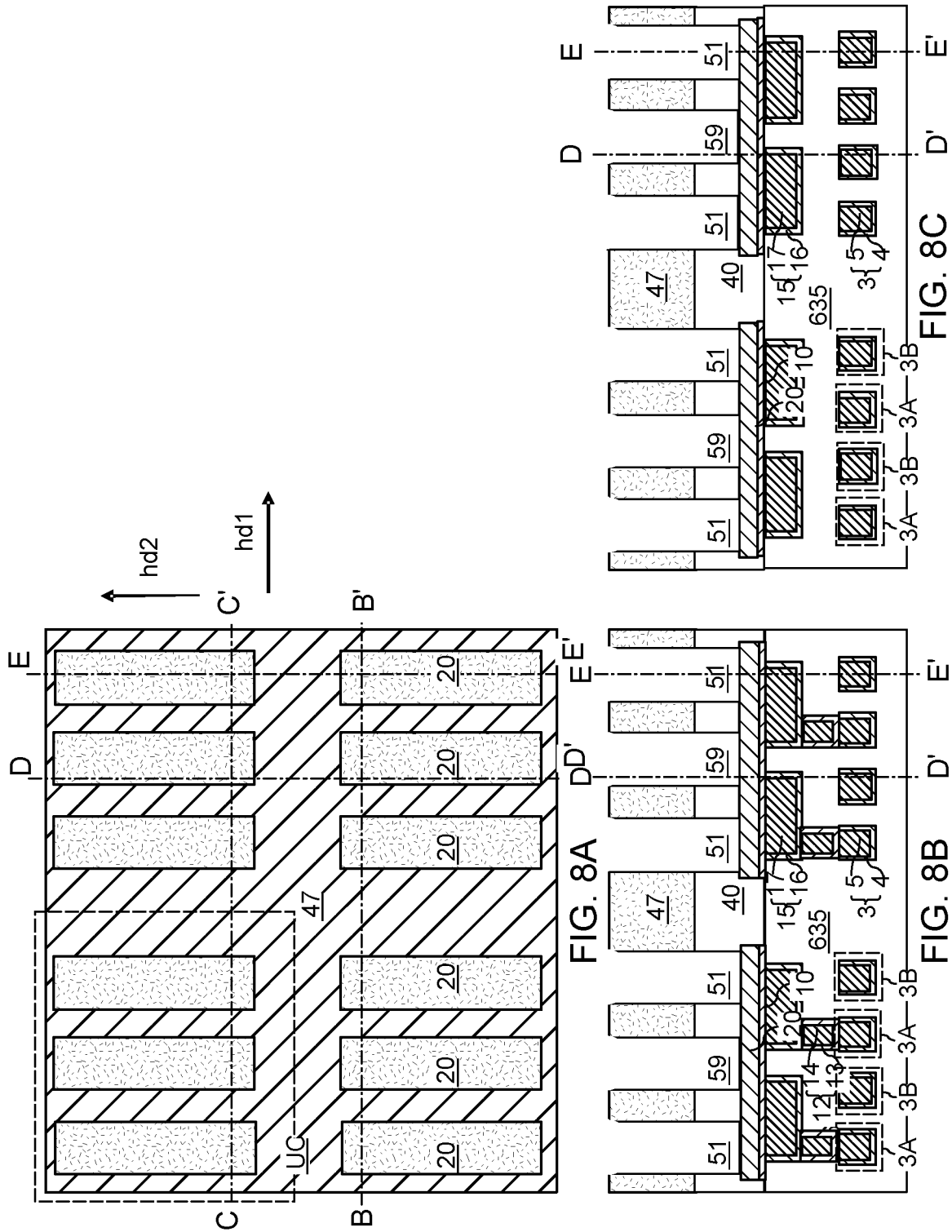

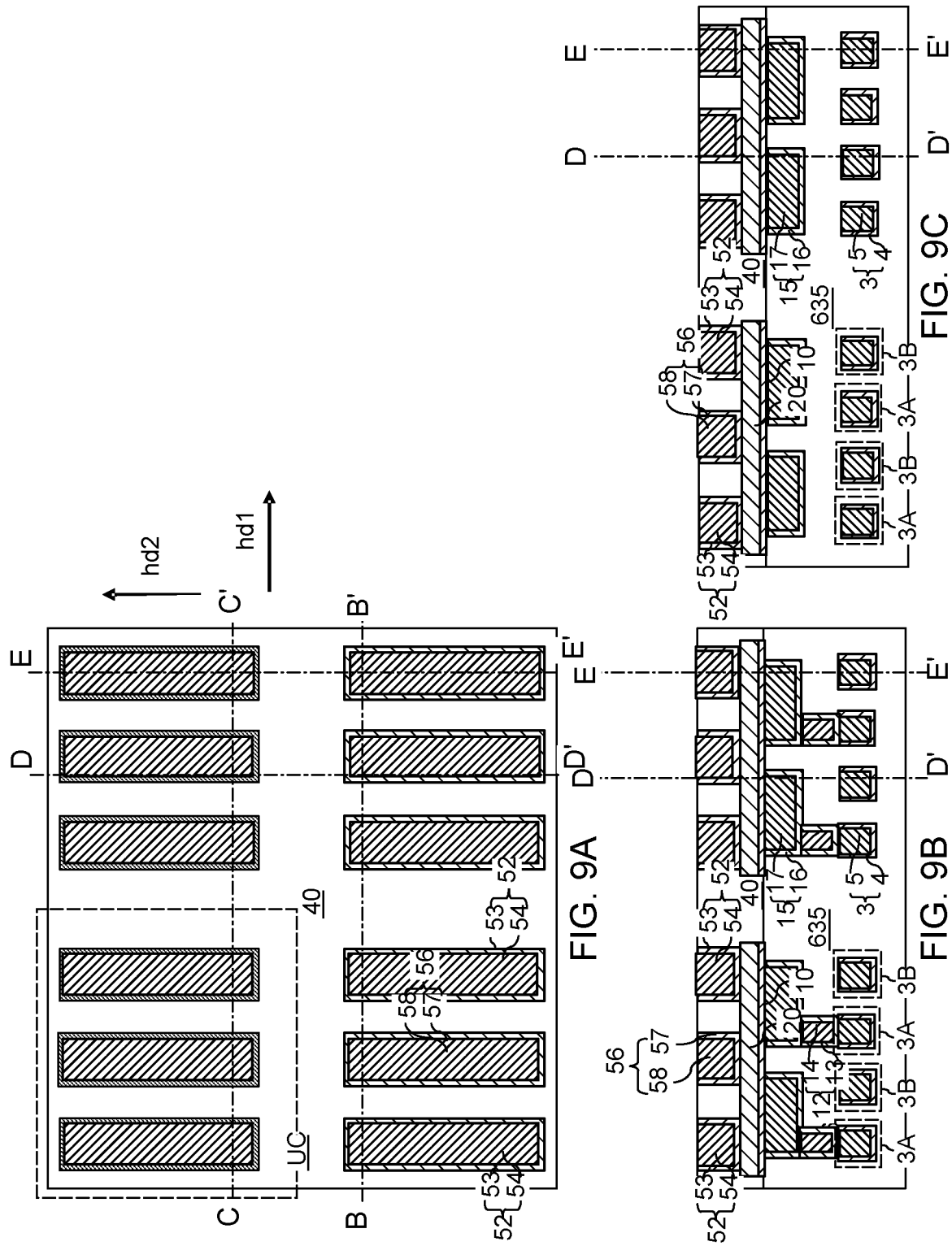

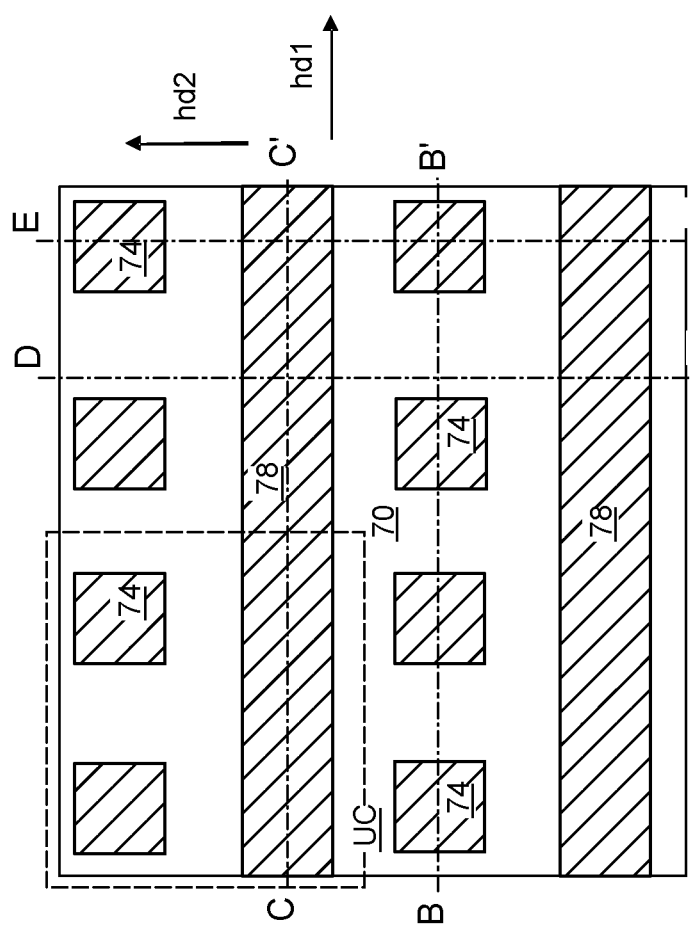
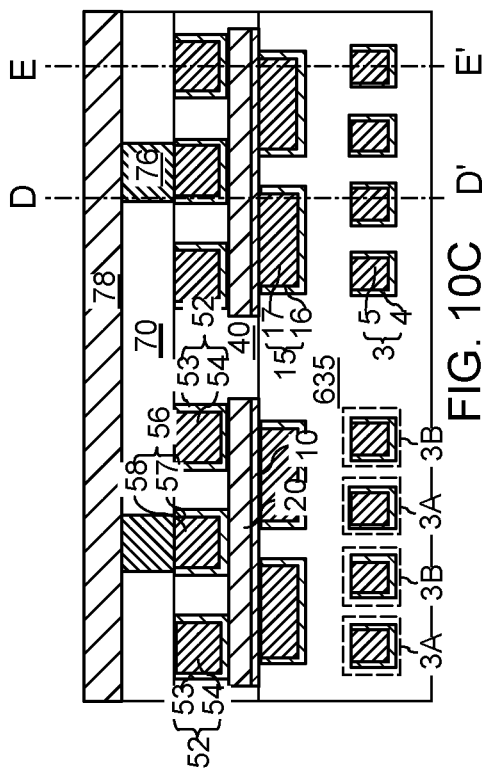
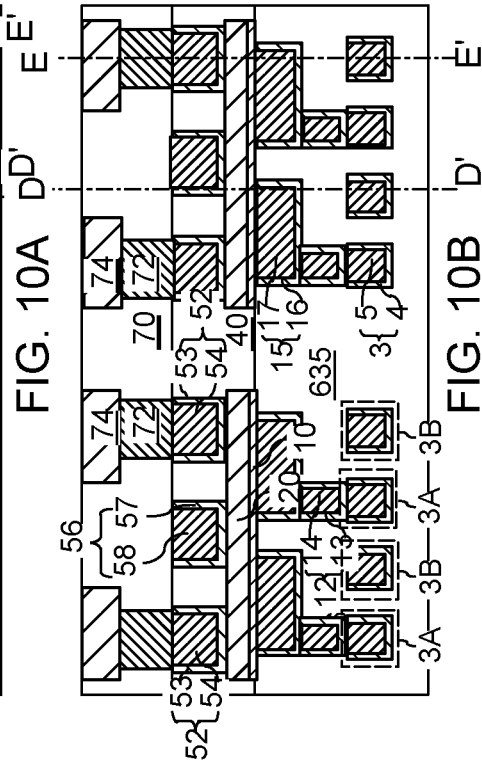
FIG. 10A
FIG. 10B
FIG. 10C

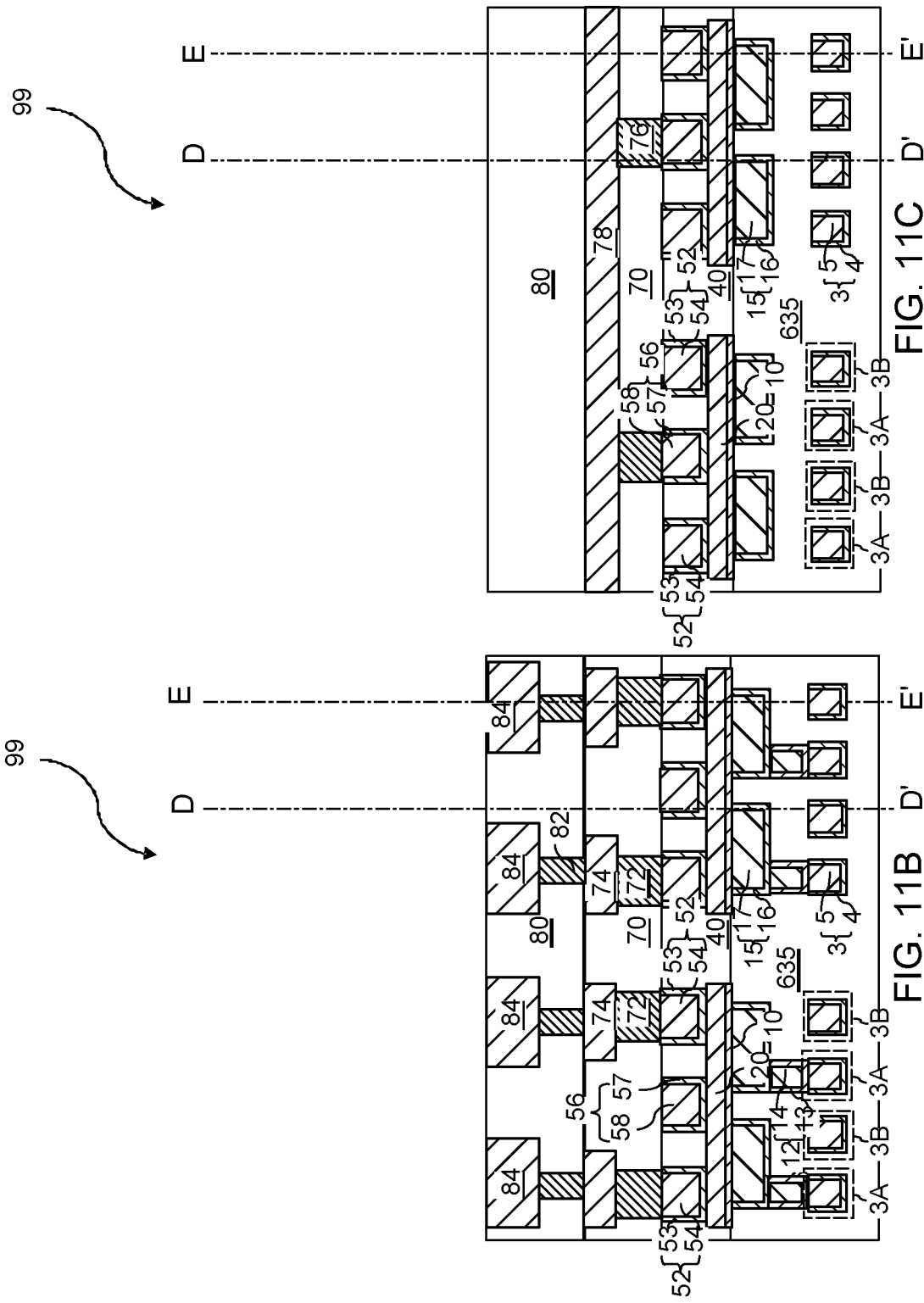

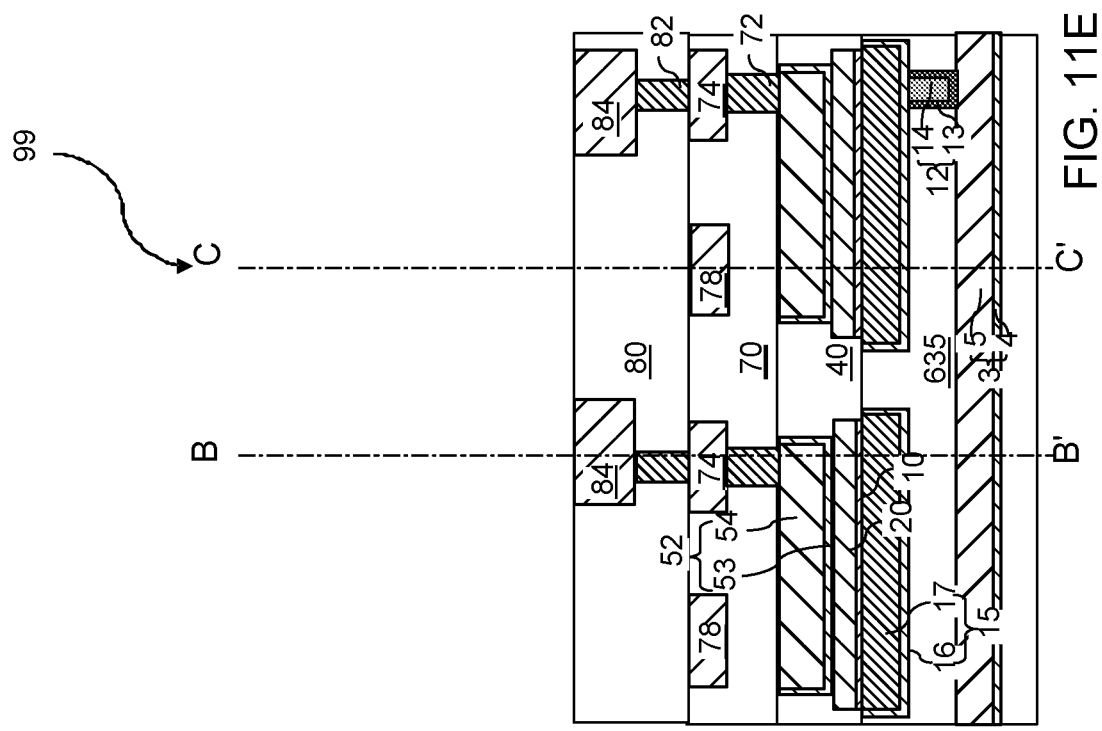
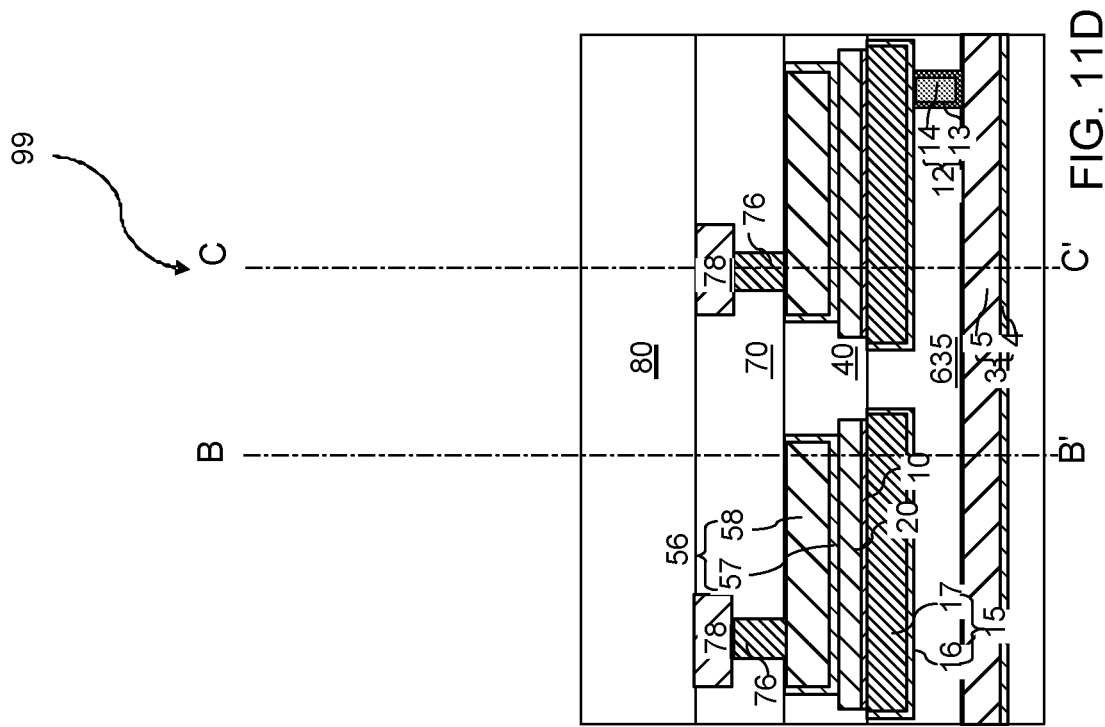

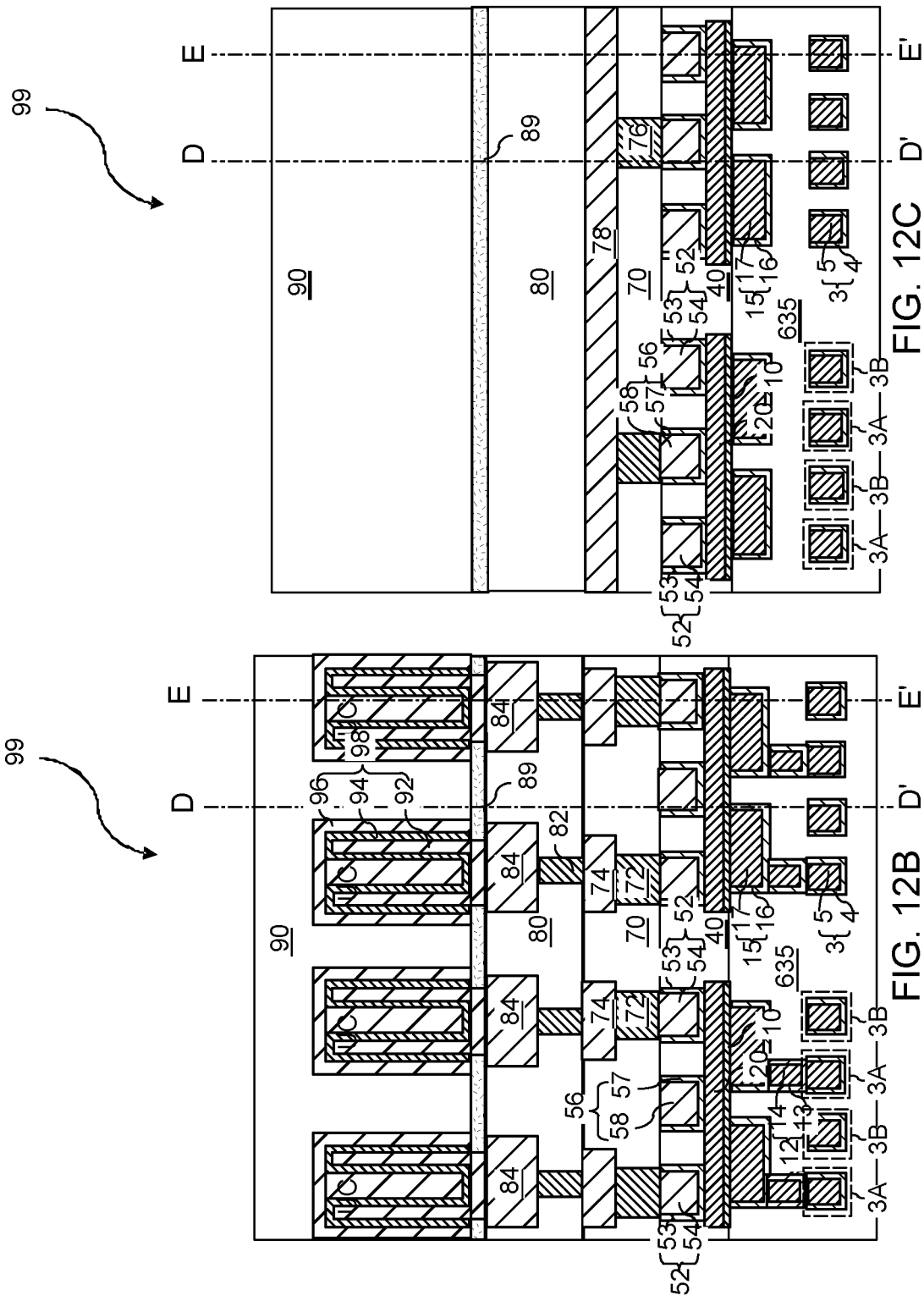

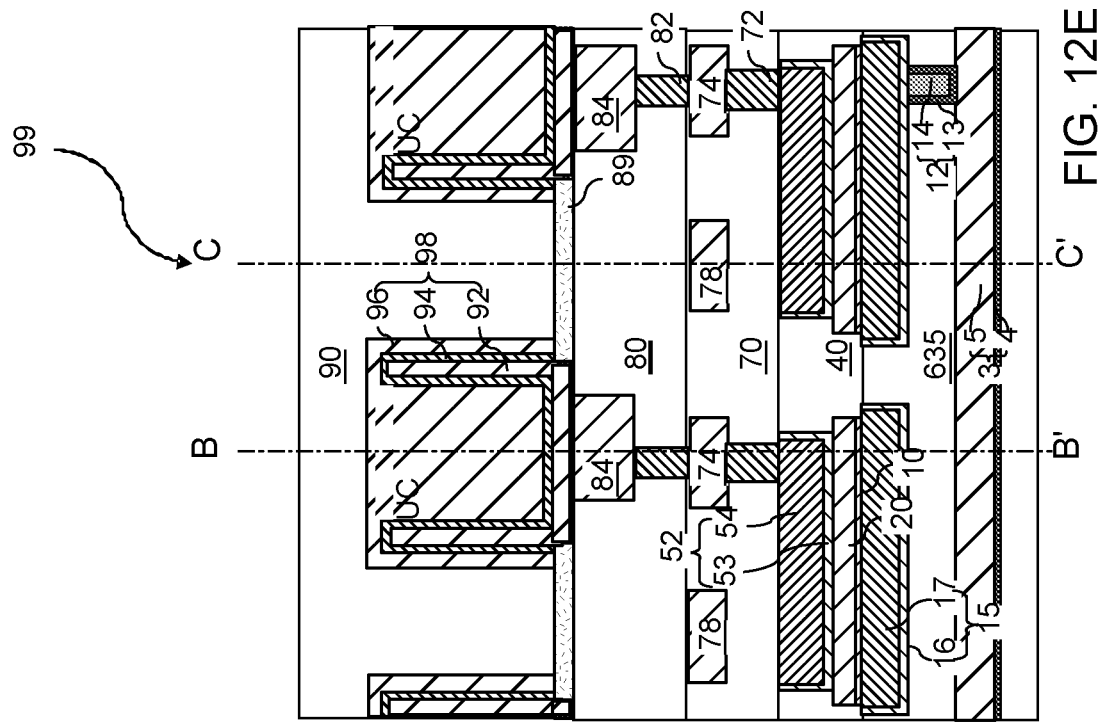
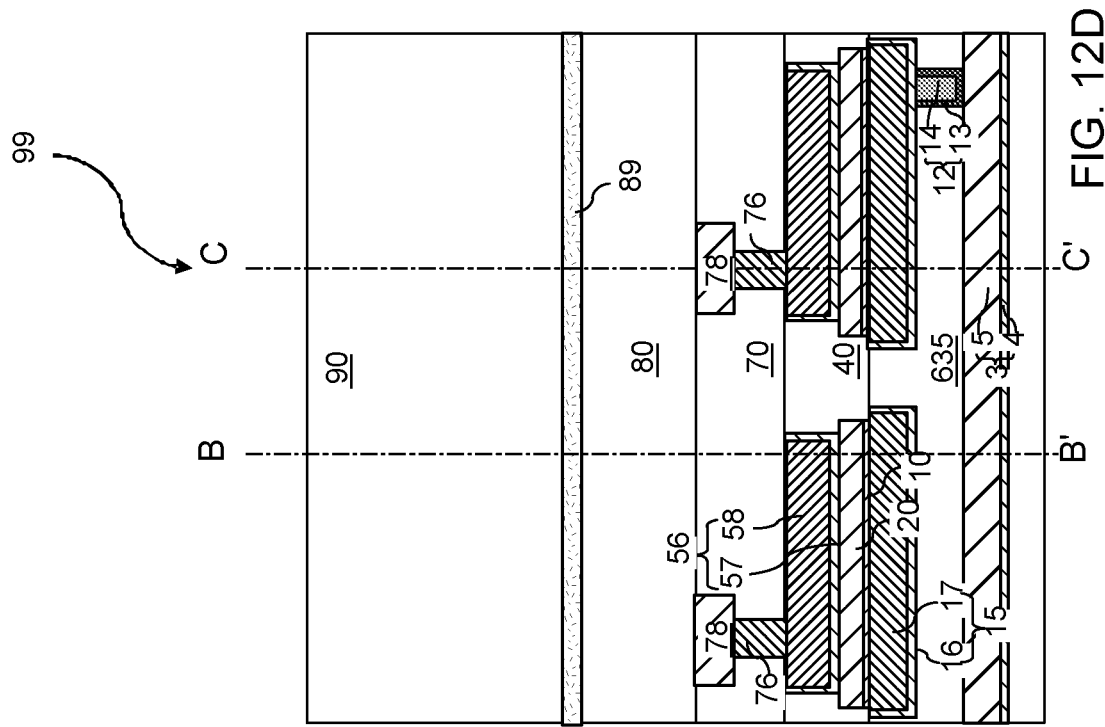
FIG. 12E
FIG. 12D

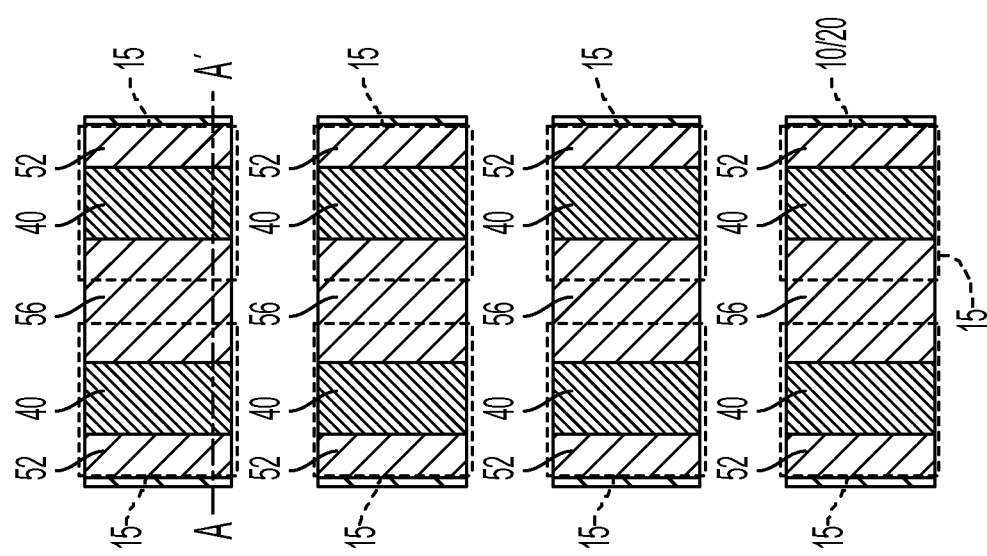

ACCESS TRANSISTORS IN A DUAL GATE LINE CONFIGURATION AND METHODS FOR FORMING THE SAME

RELATED APPLICATIONS

This application claims the benefit of priority from a U.S. provisional application Ser. No. 63/186,382, titled "BEOL Embedded Memory with improved noise immunity," filed on May 10, 2021, the entire contents of which are incorporated herein by reference.

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

Among the figures labeled with a combination of a figure numeral and an alphabetical suffix, figures with the same figure numeral correspond to a same processing step. Among figures with a figure numeral in a range from 2 to 12, figures labeled with a combination of a figure numeral and the alphabetical suffix "A" are top-down views. Among figures with a figure numeral in a range from 2 to 12, figures labeled with a combination of a figure numeral and an alphabetical suffix selected from "B," "C," "D," or "E" are vertical cross-sectional views along a vertical plane B-B', C-C', D-D', or E-E', respectively, of a structure illustrated in a figure labeled with the same figure numeral and the alphabetical index "A." Among figures with a figure numeral in a range from 2 to 12, vertical cross-sectional planes B-B', C-C', D-D', and E-E' are shown in various top-down views and various vertical cross-sectional views as applicable.

FIGS. 2A-2E are various views of a portion of a memory array region of the first exemplary structure after formation of an in-process insulating matrix layer and word line trenches according to a first embodiment of the present disclosure.

FIGS. 3A-3E are various views of the portion of the memory array region of the first exemplary structure after formation of word lines according to the first embodiment of the present disclosure.

FIGS. 4A-4E are various views of the portion of the memory array region of the first exemplary structure after formation of word-line-connection via structures according to the first embodiment of the present disclosure.

FIGS. 5A-5E are various views of the portion of the memory array region of the first exemplary structure after formation of gate electrodes according to the first embodiment of the present disclosure.

FIGS. 7A-7E are various views of the portion of the memory array region of the first exemplary structure after formation of stacks of a gate dielectric and an active layer according to the first embodiment of the present disclosure.

FIGS. 8A-8E are various views of the portion of the memory array region of the first exemplary structure after formation of a dielectric layer and source cavities and drain cavities according to the first embodiment of the present disclosure.

FIGS. 9A-9E are various views of the portion of the memory array region of the first exemplary structure after formation of source electrodes and drain electrodes according to the first embodiment of the present disclosure.

FIGS. 10A-10E are various views of the portion of the memory array region of the first exemplary structure after formation of a first upper-level dielectric material layer and first upper-level metal interconnect structures according to the first embodiment of the present disclosure.

FIGS. 11A-11E are various views of the portion of the memory array region of the first exemplary structure after formation of a second upper-level dielectric material layer and second upper-level metal interconnect structures according to the first embodiment of the present disclosure.

FIGS. 12A-12E are various views of the portion of the memory array region of the first exemplary structure after formation of capacitor structures according to the first embodiment of the present disclosure. A capacitor-level dielectric material layer is not illustrated in FIG. 12A for clarity.

FIG. 17C is a first plan view of the portion of the first exemplary structure in FIG. 17A in which a second subset of structural elements is illustrated. The vertical cross-sectional plane A-A' is the plane of the vertical cross-sectional view of FIG. 17A.

DETAILED DESCRIPTION

Figure 1:
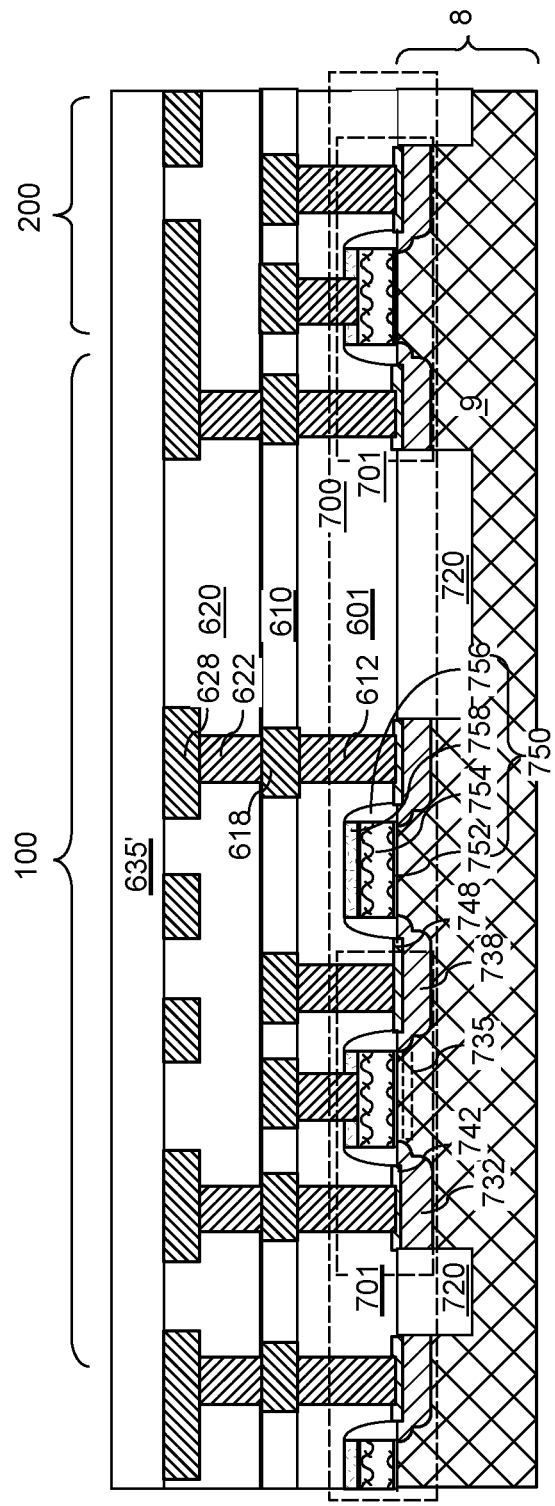
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer according to an embodiment of the present disclosure.
Figure 2D:
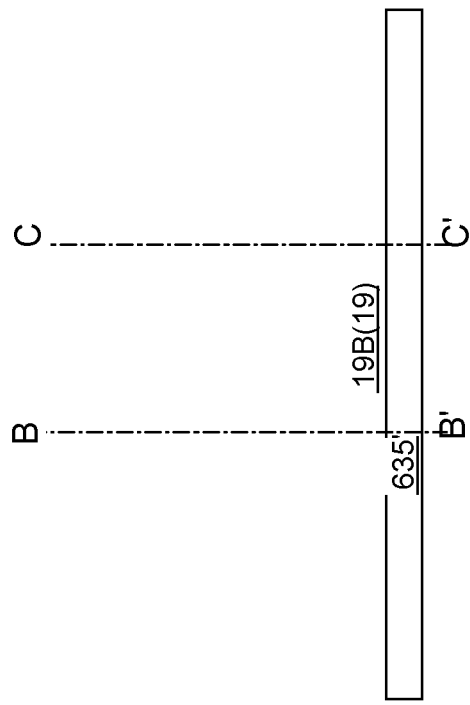
Figure 2E:
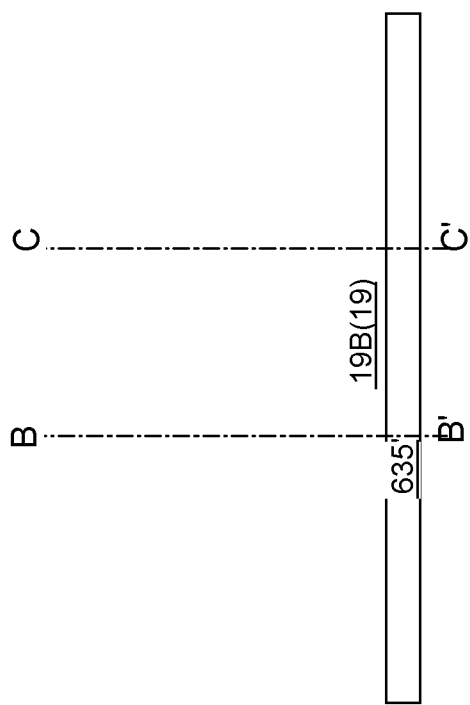
Figure 3D:
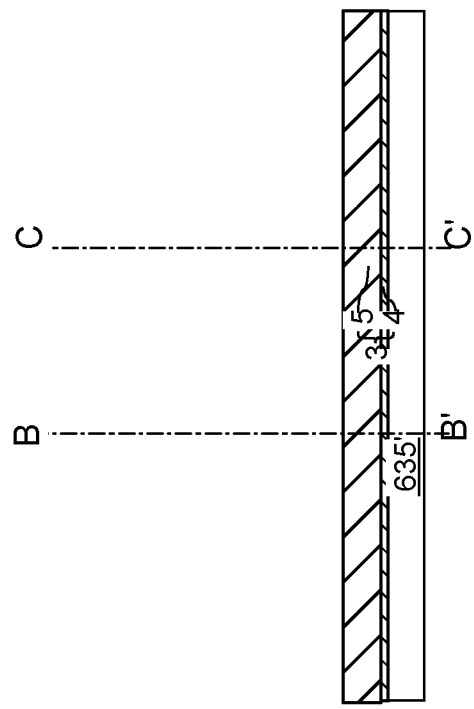
Figure 3E:
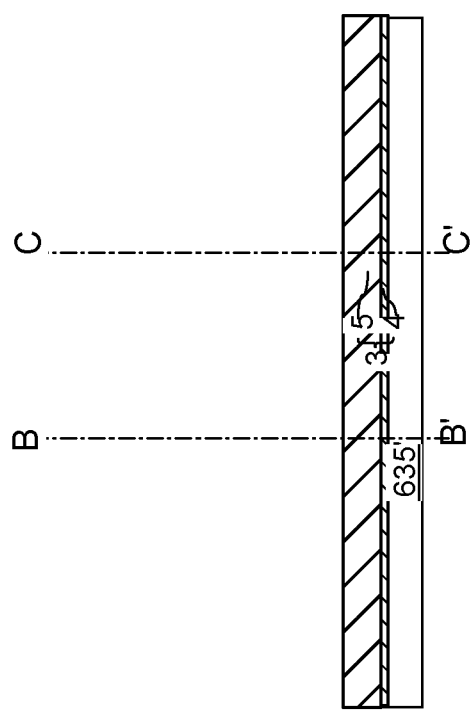
Figure 4E:
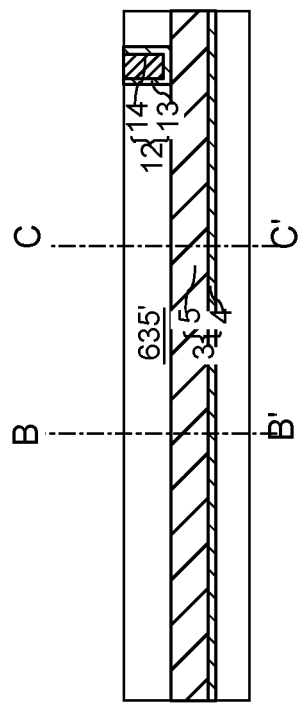
Figure 4D:
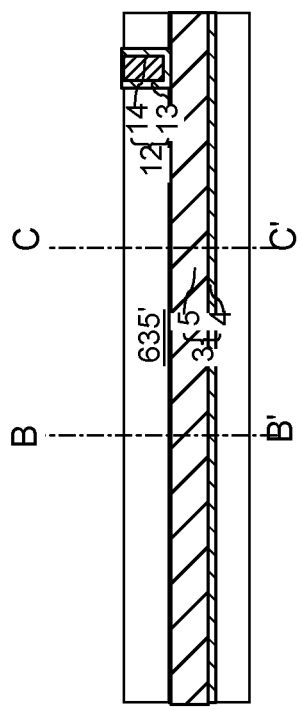
Figure 5E:
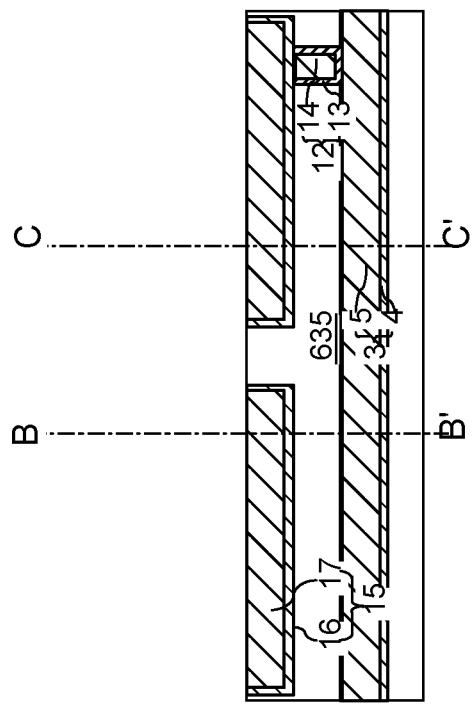
Figure 5D:
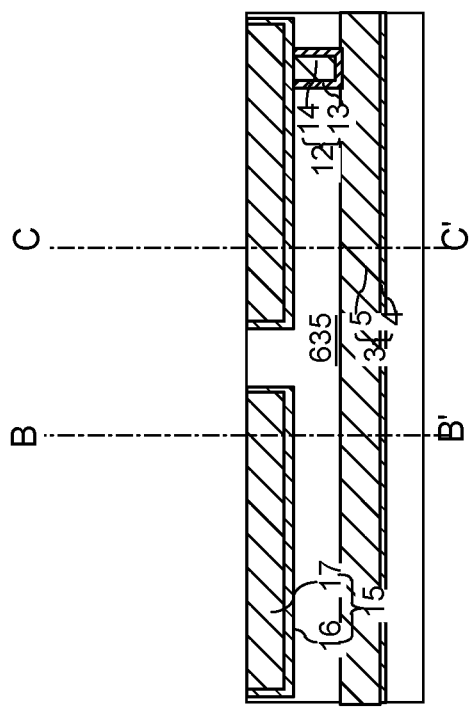
Figure 6A:
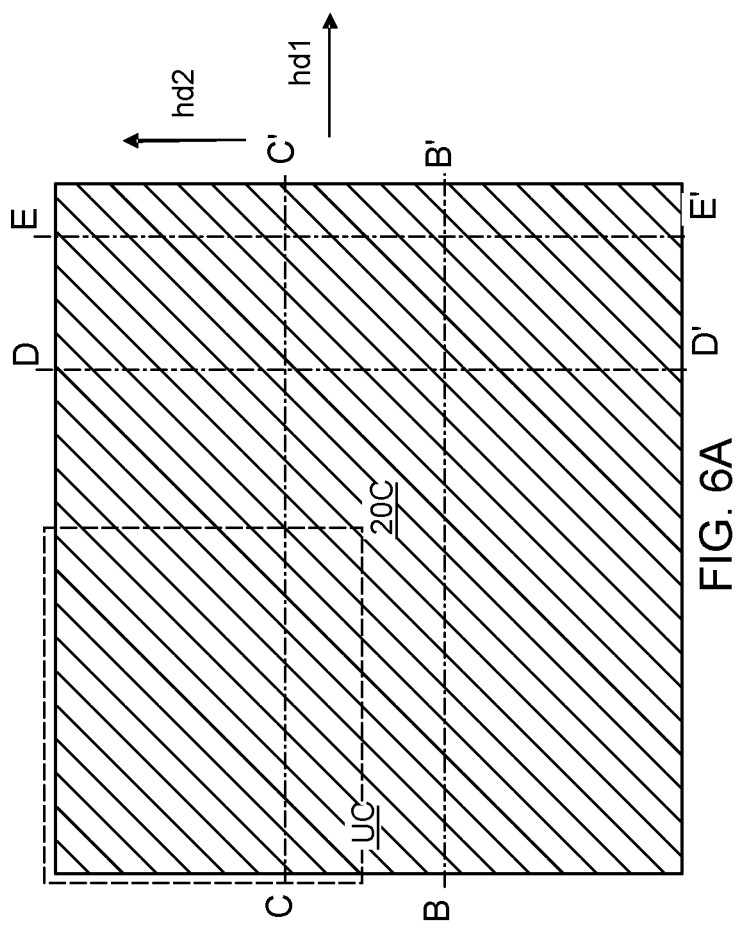
FIGS. 6A-6E are various views of the portion of the memory array region of the first exemplary structure after formation of a gate dielectric layer and a continuous active layer according to the first embodiment of the present disclosure.
Figure 6C:
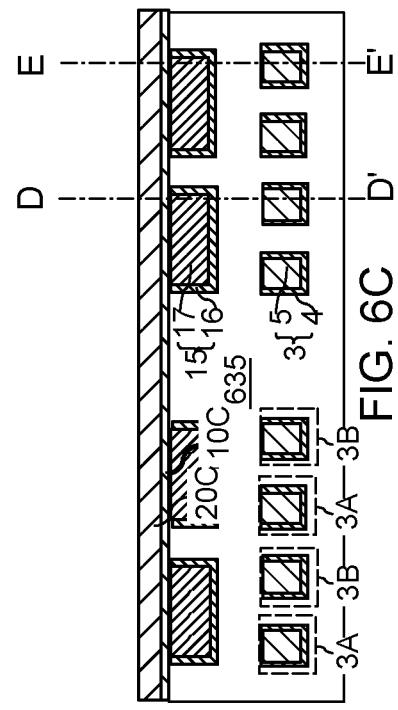
Figure 6B:
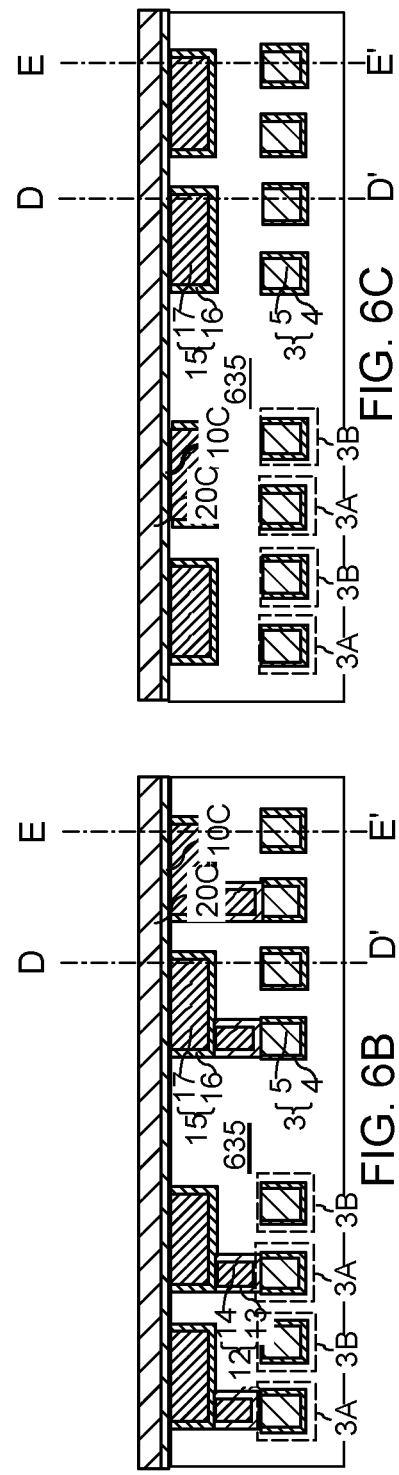
Figure 6D:
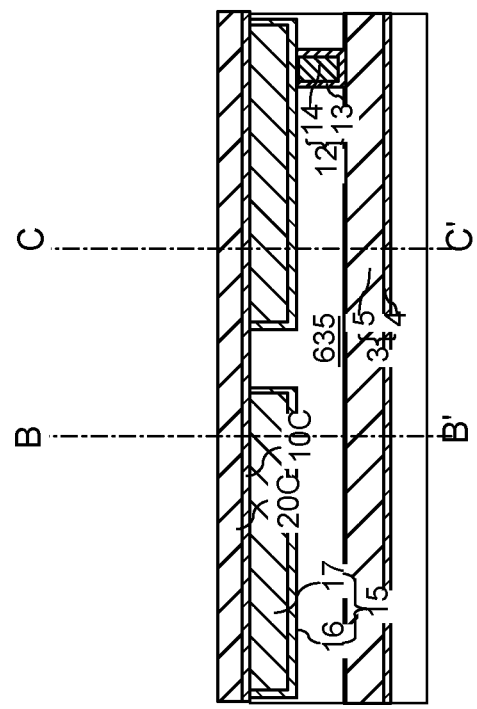
Figure 6E:
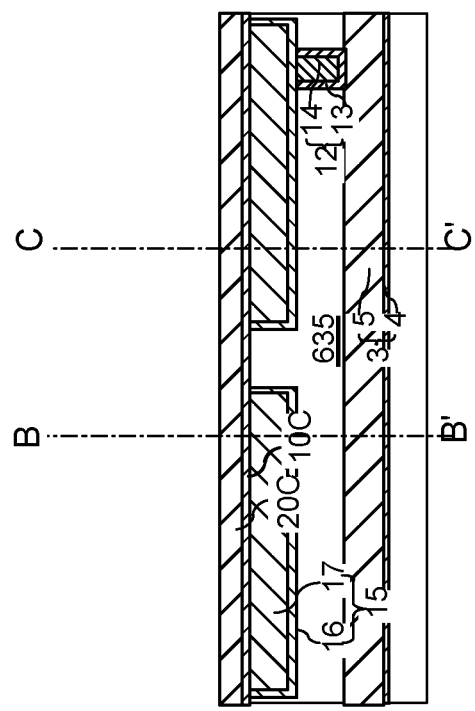
Figure 7E:
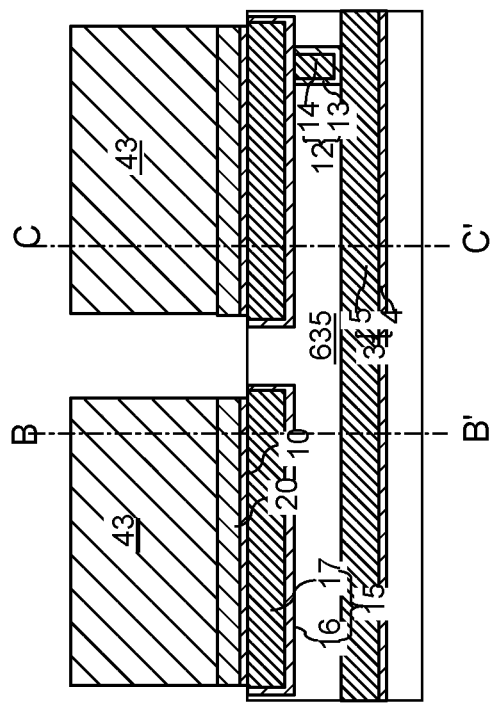
Figure 7D:
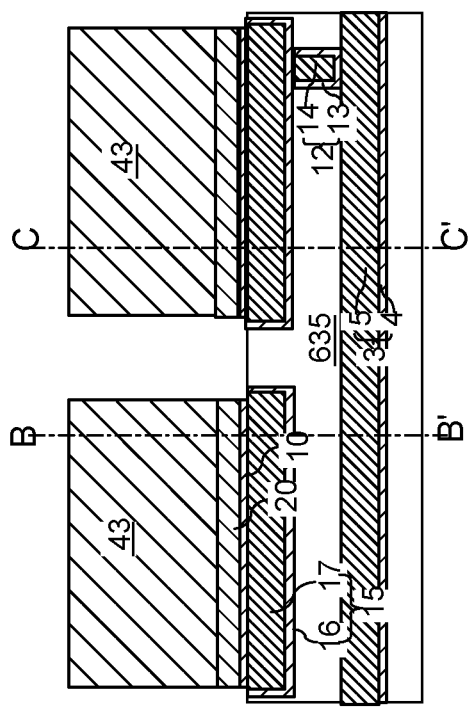
Figure 8E:
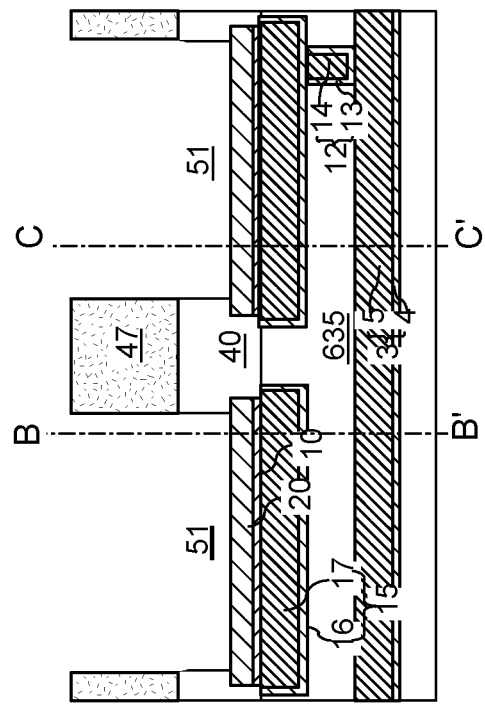
Figure 8D:
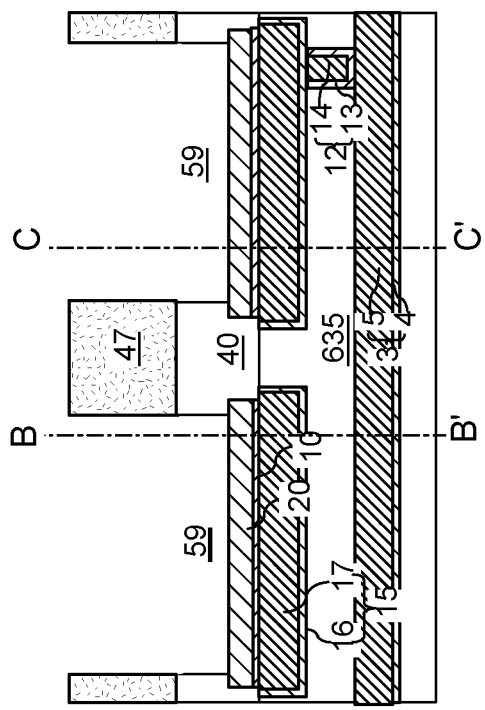
Figure 9E:
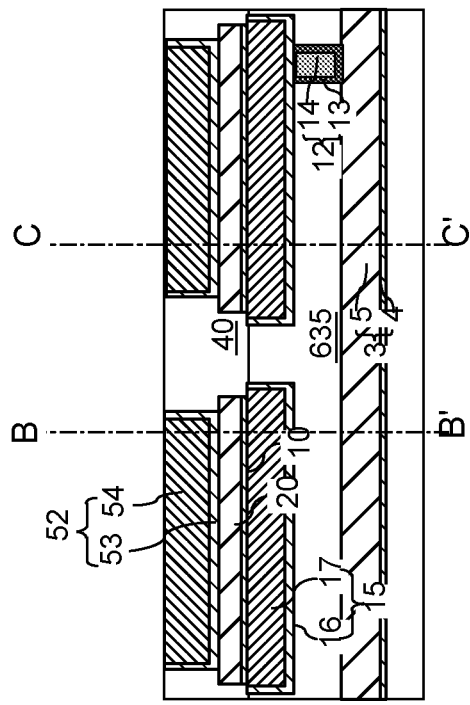
Figure 9D:
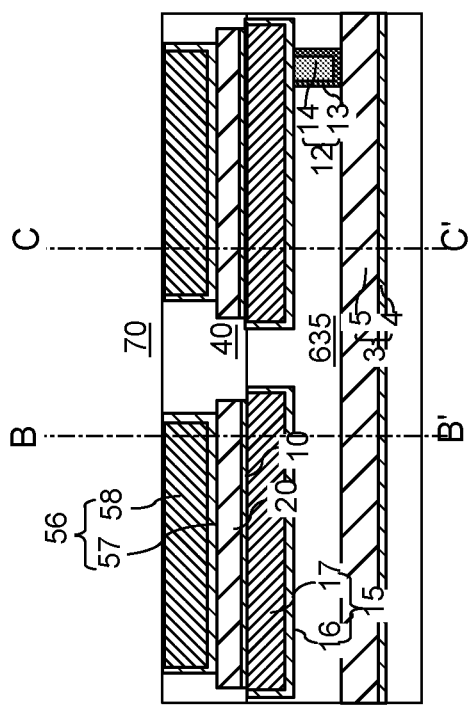
Figure 10D:
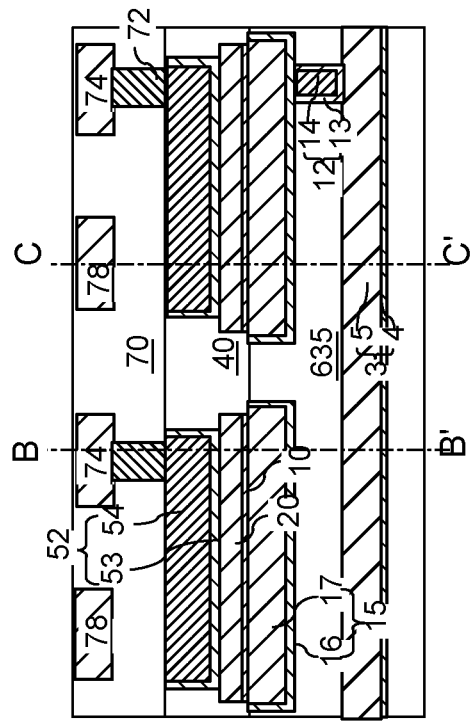
Figure 10E:
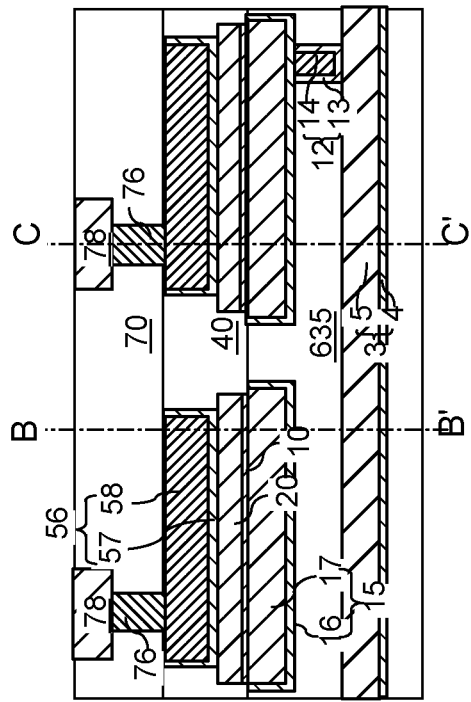
Figure 11A:
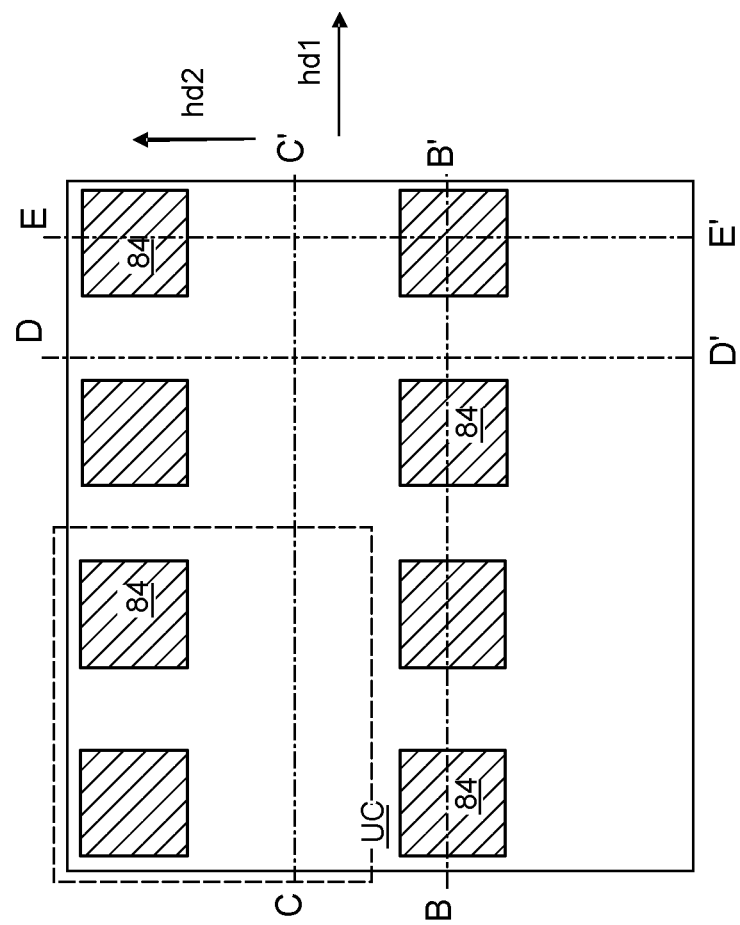

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form an embedded dynamic random access memory (DRAM) in back-end-of-line (BEOL) structures in advanced nodes. Such an embedded DRAM may provide advantage in device density over static random access memory (SRAM). The embedded DRAM of the present disclosure may be formed in a folded bit line architecture, which may provide an improved differential sensing window by keeping a primary bit line (BL) and a reference bit line (BL') (i.e., a complementary bit line that is used as a reference for operation of the sense circuit) close to each other. The present disclosure uses transistors (e.g., thin film transistors) that include a semiconducting metal oxide active layer. As such, the embedded DRAM of the present disclosure may include a BEOL structure, and does not take up device area at a front-end-of-line (FEOL) level unlike single crystalline silicon-based field effect transistors or fin field effect transistors using single crystalline semiconductor fins.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of ferroelectric memory cells may be subsequently formed. The first exemplary structure may further include a peripheral region 200 in which metal wiring for the array of ferroelectric memory devices is provided. Generally, the field effect transistors 701 in the CMOS circuitry 700 may be electrically connected to an electrode of a respective ferroelectric memory cell by a respective set of metal interconnect structures.

Devices (such as field effect transistors 701) in the peripheral region 200 may provide functions that operate the array of ferroelectric memory cells to be subsequently formed. Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitor structures, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second lower-level dielectric material layer 620, embodiments are expressly contemplated herein in which the array of memory cells may be formed at a different metal interconnect level.

An array of transistors and an array of ferroelectric memory cells may be subsequently deposited over the dielectric material layers (601, 610, 620) that have formed therein the metal interconnect structures (612, 618, 622, 628). The set of all dielectric material layer that are formed prior to formation of an array of transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, transistors (e.g., thin film transistors (TFTs)) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an in-process insulating matrix layer 635'. The in-process insulating matrix layer 635' includes a dielectric material such as undoped silicate glass, a doped silicate glass, organosilicate glass, or a porous dielectric material, and may be deposited by chemical vapor deposition. The thickness of the in-process insulating matrix layer 635' may be in a range from 20 nm to 300 nm, although lesser and greater thicknesses may also be used. Additional insulating layers may be added to, and increase the thickness of, the in-process insulating matrix layer 635' in subsequent processing steps.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The in-process insulating matrix layer 635' may be formed over the interconnect-level dielectric layers.

In one embodiment, the substrate 8 may include a single crystalline semiconductor material layer (such as a semiconductor material layer 9), and field effect transistors (such as complementary metal-oxide-semiconductor (CMOS) transistors) including a respective portion of the single crystalline semiconductor material layer as a respective channel region may be formed on the substrate 8.

A memory array including a two-dimensional array of unit cell structures may be subsequently formed over the first exemplary structure illustrated in FIG. 1.

Referring to FIGS. 2A-2E, a photoresist layer (not shown) may be applied over the in-process insulating matrix layer 635', and may be lithographically patterned to form a line-and-space pattern. Each line pattern in the patterned photoresist layer may be laterally spaced apart along a first horizontal direction hd1, and may laterally extend along a second horizontal direction hd2 that is perpendicular to the first horizontal direction hd1. In one embodiment, the line-and-space pattern in the patterned photoresist layer may be a periodic pattern having a periodicity along the first horizontal direction hd1. An area for forming a unit cell structure is marked with a dotted rectangle marked "UC," and is herein referred to as a unit cell area UC. According to an embodiment of the present disclosure, at least four spaces in the line-and-space pattern laterally extends through each unit cell area UC. In other words, each unit cell area UC includes segments of at least four space patterns.

An anisotropic etch process may be performed to transfer the pattern of the spaces into an upper portion of the in-process insulating matrix layer 635'. Line trenches, which are herein referred to as word line trenches 19, may be formed in the voids from which the material of the in-process insulating matrix layer 635' is removed by the anisotropic etch process. The word line trenches may laterally extend along the second horizontal direction hd2, and may be laterally spaced from one another along the first horizontal direction hd1. In one embodiment, the word line trenches 19 may comprise straight line trenches having straight sidewalls that laterally extend along the second horizontal direction hd2. The word line trenches 19 may have a periodicity along the first horizontal direction hd1 that is the same as the width of the unit cell area UC along the first horizontal direction hd1. In one embodiment, the word line trenches 19 may have a same width along the first horizontal direction hd1 irrespective of the location. The depth of the word line trenches 19 may be in a range from 10 nm to 300 nm, such as from 30 nm to 100 nm, although lesser and greater depths may also be used. Upon sequentially numbering of the word line trenches 19 with positive integers beginning with 1 along the first horizontal direction, the word line trenches 19 may comprise odd-numbered word line trenches 19 which are herein referred to as first word line trenches 19A, and even-numbered word line trenches 19 which are herein referred to as second word line trenches 19B. The patterned photoresist layer may be subsequently removed, for example, by ashing.

Referring to FIGS. 3A-3E, at least one metallic material may be deposited in the word line trenches 19. For example, a word-line metallic liner layer including a metallic barrier material and a word-line metallic fill material layer including a metallic fill material may be sequentially deposited in the word line trenches 19 and over the in-process insulating matrix layer 635'. The word-line metallic liner layer may include a metallic barrier material such as TiN, TaN, WN, TiC, TaC, WC, or a stack thereof, and may be deposited by physical vapor deposition or chemical vapor deposition. The thickness of the word-line metallic liner layer may be in a range from 1 nm to 30 nm, although lesser and greater thicknesses may also be used. The word-line metallic fill material layer may include W, Cu, Al, Co, Ru, Mo, Ta, Ti, alloys thereof, and/or combinations thereof. The thickness of the word-line metallic fill material layer may be selected such that the each of the word line trenches 19 is filled with the combination of the word-line metallic liner layer and the word-line metallic fill material layer.

A planarization process, such as a chemical mechanical polishing (CMP) process, may be performed to remove portions of the word-line metallic liner layer and the word-line metallic fill material layer that overlie the horizontal plane including the top surface of the in-process insulating matrix layer 635'. Each remaining contiguous portion of the word-line metallic liner layer and the word-line metallic fill material layer filling a respective word line trench 19 constitutes a word line 3. Each word line 3 may include a word-line metallic liner 4 and a word-line metallic fill material portion 5. Each word-line metallic liner 4 is a portion of the word-line metallic liner layer that remains after the planarization process. Each word-line metallic fill material portion 5 is a portion of the word-line metallic fill material layer that remains after the planarization process.

The word lines 3 comprise first word lines 3A that fill the first word line trenches 19A and second word lines 3B that fill the second word line trenches 19B. First word lines 3A and second word lines 3B alternate along the first horizontal direction hd1. Each unit cell area UC includes segments of at least four different word lines 3, which include at least two first word lines 3A and at least two second word lines 3B.

Referring to FIGS. 4A-4E, an insulating material layer (which is herein referred to as a via-level insulating layer) may be deposited over the in-process insulating matrix layer 635', and may be incorporated into the in-process insulating matrix layer 635'. The thickness of the in-process insulating matrix layer 635' may increase by the thickness of the added insulating material layer, which may be, for example, in a range from 30 nm to 300 nm, such as from 60 nm to 150 nm, although lesser and greater thicknesses may also be used.

Via cavities may be formed through the in-process insulating matrix layer 635' such that top surfaces of the word lines 3 may be physically exposed at the bottom of the via cavities. According to an aspect of the present disclosure, two via cavities may be formed within each unit cell area UC. In one embodiment, top surfaces of two first word lines 3A may be physically exposed in a unit cell area UC, and top surfaces of two second word lines 3B may be physically exposed in an adjacent unit cell area UC that is laterally offset from the unit cell area UC along the second horizontal direction hd2. Thus, the type of word lines 3 (i.e., the first word lines 3A or the second word lines 3B) that are physically exposed underneath via cavities may alternate along the second horizontal direction hd2. In one embodiment, the type of word lines 3 that is physically exposed underneath the via cavities may be the same along the first horizontal direction hd1, and may alternate between the first word lines 3A and the second word lines 3B along the second horizontal direction hd2. As such, locations of the via cavities may be staggered along the second horizontal direction hd2.

At least one metallic material may be deposited in the via cavities. For example, a via metallic liner layer including a metallic barrier material and a via metallic fill material layer including a metallic fill material may be sequentially deposited in the via cavities and over the in-process insulating matrix layer 635'. The via metallic liner layer may include a metallic barrier material such as TiN, TaN, WN, TiC, TaC, WC, or a stack thereof, and may be deposited by physical vapor deposition or chemical vapor deposition. The thickness of the via metallic liner layer may be in a range from 1 nm to 30 nm, although lesser and greater thicknesses may also be used. The via metallic fill material layer may include W, Cu, Al, Co, Ru, Mo, Ta, Ti, alloys thereof, and/or combinations thereof. The thickness of the via metallic fill material layer may be selected such that the each of the via cavities is filled with the combination of the via metallic liner layer and the via metallic fill material layer.

A planarization process, such as a chemical mechanical polishing (CMP) process, may be performed to remove portions of the via metallic liner layer and the via metallic fill material layer that overlie the horizontal plane including the top surface of the in-process insulating matrix layer 635'. Each remaining contiguous portion of the via metallic liner layer and the via metallic fill material layer filling a respective via cavity constitutes a word-line-connection via structure 12. Each word-line-connection via structure 12 may include a via metallic liner 13 and a via metallic fill material portion 14. Each via metallic liner 13 is a portion of the via metallic liner layer that remains after the planarization process. Each via metallic fill material portion 14 is a portion of the via metallic fill material layer that remains after the planarization process.

Each unit cell area UC includes a pair of word-line-connection via structures 12. Generally, each of the word-line-connection via structures 12 may be formed on a top surface of a respective one of the word lines 3.

Referring to FIGS. 5A-5E, an additional insulating material layer (which is herein referred to as a gate-level insulating layer) may be deposited over the in-process insulating matrix layer 635', and may be incorporated into the in-process insulating matrix layer 635'. The thickness of the in-process insulating matrix layer 635' may increase by the thickness of the added insulating material layer, which may be, for example, in a range from 30 nm to 300 nm, such as from 60 nm to 150 nm, although lesser and greater thicknesses may also be used. The in-process insulating matrix layer 635' becomes an insulating matrix layer 635, which does not increase in thickness in subsequent processing steps.

Gate cavities (not shown) may be formed through the insulating matrix layer 635 such that top surfaces of the word-line-connection via structures 12 may be physically exposed at the bottom of the gate cavities. According to an aspect of the present disclosure, two gate cavities may be formed within each unit cell area UC. In one embodiment, top surfaces of two word-line-connection via structures 12 may be physically exposed in a unit cell area UC. A top surface of a word-line-connection via structure 12 may be physically exposed at the bottom of each gate cavity.

In one embodiment, each of the gate cavities may have a respective rectangular horizontal cross-sectional shape. According to an embodiment of the present disclosure, each of the gate cavities may have a pair of first sidewalls that are parallel to the first horizontal direction hd1 and a pair of second sidewalls that are parallel to the second horizontal direction hd2. In one embodiment, each unit cell area UC may include two discrete gate cavities having rectangular horizontal cross-sectional shapes, and the areas of the two discrete gate cavities may be located entirety within the unit cell area UC. The two discrete gate cavities within each unit cell area UC may be laterally spaced from each other by a uniform separation distance. Generally, the pair of first sidewalls of each gate cavity may, or may not, be parallel to the first horizontal direction hd1, and the pair of second sidewalls of each gate cavity may, or may not, be parallel to the second horizontal direction hd2.

At least one metallic material may be deposited in the gate cavities. For example, a gate metallic liner layer including a metallic barrier material and a gate metallic fill material layer including a metallic fill material may be sequentially deposited in the gate cavities and over the insulating matrix layer 635. The gate metallic liner layer may include a metallic barrier material such as TiN, TaN, WN, TiC, TaC, WC, or a stack thereof, and may be deposited by physical vapor deposition or chemical vapor deposition. The thickness of the gate metallic liner layer may be in a range from 1 nm to 30 nm, although lesser and greater thicknesses may also be used. The gate metallic fill material layer may include W, Cu, Al, Co, Ru, Mo, Ta, Ti, alloys thereof, and/or combinations thereof. The thickness of the gate metallic fill material layer may be selected such that the each of the gate cavities is filled with the combination of the gate metallic liner layer and the gate metallic fill material layer.

A planarization process, such as a chemical mechanical polishing (CMP) process, may be performed to remove portions of the gate metallic liner layer and the gate metallic fill material layer that overlie the horizontal plane including the top surface of the insulating matrix layer 635. Each remaining contiguous portion of the gate metallic liner layer and the gate metallic fill material layer filling a respective gate cavity constitutes a gate electrode 15. Each gate electrode 15 may include a gate metallic liner 16 and a gate metallic fill material portion 17. Each gate metallic liner 16 is a portion of the gate metallic liner layer that remains after the planarization process. Each gate metallic fill material portion 17 is a portion of the gate metallic fill material layer that remains after the planarization process.

A pair of gate electrodes 15 may be formed within each unit cell area UC. The pair of gate electrodes 15 may include a first gate electrode 15A and a second gate electrode 15B. Each word-line-connection via structure that contacts a bottom surface of a first gate electrode 15A is herein referred to as a first word-line-connection via structure 12, which contacts a top surface of one of two word lines (3A, 3B) that underlie the first gate electrode 15A. Each word-line-connection via structure that contacts a bottom surface of a second gate electrode 15B is herein referred to as a second word-line-connection via structure 12, which contacts a top surface of one of two word lines (3A, 3B) that underlie the second gate electrode 15B. Generally, a first word line 3A and a second word line 3B may underlie a first gate electrode 15A in a unit cell area UC, and an additional first word line 3A and an additional second word line 3B may underlie a second gate electrode 15B in the unit cell area UC.

In one embodiment, two first word lines 3A selected from the four word lines 3 that extend through a unit cell area UC may be electrically connected to a respective one of the first gate electrode 15A and the second gate electrode 15B within the unit cell area UC. In another embodiment, two second word lines 3B selected from the four word lines 3 that extend through a unit cell area UC may be electrically connected to a respective one of the first gate electrode 15A and the second gate electrode 15B within the unit cell area UC. In one embodiment, for each neighboring pair of unit cell areas UC that are adjacent to each other and are laterally spaced from each other along the second horizontal direction hd2, the gate electrodes 15 within one of the unit cell areas UC may be electrically connected to two first word lines 3A, and the gate electrodes 15 within another of the unit cell areas UC may be electrically connected to two second word lines 3B.

In one embodiment, each unit cell area UC may include a first gate electrode 15A and a second gate electrode 15B, and four word lines 3 may extend underneath the two gate electrodes (15A, 15B). Two word lines (3A or 3B) of the four word lines 3 may be active word lines for a first unit cell area UC that are electrically connected to the two gate electrodes (15A, 15B) and the other two word lines (3B or 3A) of the four word lines 3 may be passing word lines for the first unit cell area UC that are electrically isolated from the two gate electrodes (15A, 15B). Within a second unit cell area UC that borders the first unit cell area UC and is laterally spaced from the first unit cell area UC along the second horizontal direction hd2, the two word lines (3A or 3B) that are electrically connected to the gate electrodes (15A, 15B) in the first unit cell area UC become passing word lines that are electrically isolated from any gate electrode (15A, 15B) within the second unit cell area UC, and the two word lines (3B or 3A) that are electrically floating in the first unit cell area UC become active word lines for the second unit cell area UC that are electrically connected to the two gate electrodes (15A, 15B) in the second unit cell area UC.

Within each unit cell area UC, a first word-line-connection via structure 12 may contact a bottom surface of a first gate electrode 15A and a top surface of one of the two active word lines (which may be two first word lines 3A or two second word lines 3B), and a second word-line-connection via structure 12 may contact a bottom surface of a second gate electrode 15B and a top surface of another of the two active word lines.

Referring to FIGS. 6A-6E, a gate dielectric layer 10C and a continuous active layer 20C may be sequentially deposited over the insulating matrix layer 635 and the gate electrodes 15. The gate dielectric layer 10C may be formed over the insulating matrix layer 635 and the gate electrodes 15 by deposition of at least one gate dielectric material. The gate dielectric material may include, but is not limited to, silicon oxide, silicon oxynitride, a dielectric metal oxide (such as aluminum oxide, hafnium oxide, yttrium oxide, lanthanum oxide, etc.), or a stack thereof. Other suitable dielectric materials are within the contemplated scope of disclosure. The gate dielectric material may be deposited by atomic layer deposition or chemical vapor deposition. The thickness of the gate dielectric layer 10C may be in a range from 1 nm to 100 nm, such as from 3 nm to 30 nm, although lesser and greater thicknesses may also be used.

The continuous active layer 20C including a semiconducting material may be deposited over the gate dielectric layer 10C. The continuous active layer 20C may be an un-patterned (i.e., blanket) semiconductor material layer. In one embodiment, the continuous active layer 20C may comprise a compound semiconductor material. In one embodiment, the semiconducting material includes a material providing electrical conductivity in a range from 1.0 S/m to $1.0 \times 10^5$ S/m upon suitable doping with electrical dopants (which may be p-type dopants or n-type dopants). Exemplary semiconducting materials that may be used for the continuous active layer 20C include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Generally, the continuous active layer 20C may comprise oxides of at least one metal, such as at least two metals and/or at least three metals, selected from In, Zn, Ga, Sn, Pb, Zr, Sr, Ru, Mn, Mg, Nb, Ta, Hf, Al, La, Sc, Ti, V, Cr, Mo, W, Fe, Co, Ni, Pd, Ir, Ag, and any combination of the above. Some of the metal elements may be present at a dopant concentration, e.g., at an atomic percentage less than 1.0%. Other suitable semiconducting materials are within the contemplated scope of disclosure. In one embodiment, the semiconducting material of the continuous active layer 20C may include indium gallium zinc oxide.

The continuous active layer 20C may include a polycrystalline semiconducting material, or an amorphous semiconducting material that may be subsequently annealed into a polycrystalline semiconducting material having a greater average grain size. The continuous active layer 20C may be deposited by physical vapor deposition although other suitable deposition processes may be used. The thickness of the continuous active layer 20C may be in a range from 1 nm to 300 nm, such as from 2 nm to 100 nm and/or from 4 nm to 50 nm, although lesser and greater thicknesses may also be used.

Referring to FIGS. 7A-7E, a photoresist layer 43 may be applied over the continuous active layer 20C, and may be lithographically patterned to form discrete patterned photoresist material portion. Each patterned portion of the photoresist layer 43 may be located within the area of a respective one of the unit cell areas UC. A single discrete patterned photoresist material portion may be formed within each unit cell area UC. The area of each patterned portion of the photoresist layer 43 may define the area of a semiconducting metal oxide portion to be subsequently patterned from the continuous active layer 20C. In one embodiment, each patterned portion of the photoresist layer 43 may have a horizontal cross-sectional shape of a rectangle or a rounded rectangle.

The pattern in the photoresist layer 43 may be transferred through the continuous active layer 20C and the gate dielectric layer 10C by performing an anisotropic etch process. Patterned portion of the continuous active layer 20C comprise a two-dimensional array of active layers 20. Patterned portion of the gate dielectric layer 10C comprise a two-dimensional array of gate dielectrics 10. A two dimensional array of layer stacks of a gate dielectric 10 and an active layer 20 may be formed. Sidewalls of the gate dielectric 10 and the active layer 20 within each layer stack may be vertically coincident, i.e., may be located within a same vertical plane. The photoresist layer 43 may be subsequently removed, for example, by ashing.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

Generally, a semiconductor material layer such as the continuous active layer 20C and the gate dielectric layer 10C may be patterned into the two-dimensional array of layer stacks (10, 20). Each layer stack includes a gate dielectric 10 and an active layer 20. The active layer 20 may include, and/or consists essentially of, a semiconducting metal oxide material. Each of the active layers 20 may include a pair of lengthwise sidewalls that extend along a channel direction (i.e., the direction of current flow between a source electrode and a drain electrode) and a pair of widthwise sidewalls that extend along a direction that is perpendicular to the channel direction. In one embodiment, the pair of widthwise sidewalls may be parallel to a lengthwise direction of the word lines 3, and the pair of lengthwise sidewall may be perpendicular to the lengthwise direction of the word lines 3.

According to an aspect of the present disclosure, a two-dimensional array of layer stacks (10, 20) may be formed over a two-dimensional array of gate electrodes 15. Each of the layer stacks (10, 20) may include a gate dielectric 10 and an active layer 20. Each of the active layers 20 has an areal overlap with, and overlies, a respective set of two gate electrodes (15A, 15B), a respective set of two word lines (3A or 3B), and a respective set of two additional word lines (3B or 3A). The respective set of two word lines (3A or 3B) may be electrically connected to the respective set of two gate electrodes (15A, 15B), and the respective set of two additional word lines (3B or 3A) may be electrically isolated from the respective set of two gate electrodes (15A, 15B). In first-type unit cell areas UC that are approximately about 50% of all unit cell areas UC, a set of two first word lines 3A may be electrically connected to the respective set of two gate electrodes (15A, 15B), and a respective set of two second word lines 3B may be electrically isolated from the respective set of two gate electrodes (15A, 15B). In second-type unit cell areas UC that are approximately about 50% of all unit cell areas UC, a set of two second word lines 3B may be electrically connected to the respective set of two gate electrodes (15A, 15B), and a respective set of two first word lines 3A may be electrically isolated from the respective set of two gate electrodes (15A, 15B).

Structures within each unit cell area UC include: an active layer 20 that includes a semiconductor material (which may be a compound semiconductor material such as a semiconducting metal oxide material); a gate dielectric 10 underlying the active layer 20; a first gate electrode 15A underlying a first portion of the gate dielectric 10; a second gate electrode 15B underlying a second portion of the gate dielectric 10; and at least four word lines (3A, 3B) having an areal overlap with the active layer 20 in a plan view and underlying the active layer 20. A first word line (3A or 3B) selected from the at least four word lines (3A, 3B) is electrically connected to the first gate electrode 15A, a second word line (3A or 3B) selected from the at least four word lines is electrically connected to the second gate electrode 15B, and all word lines selected from the at least four word lines (3A, 3B) other than the first word line (3A or 3B) and the second word line (3A or 3B) are electrically isolated from the first gate electrode 15A and the second gate electrode 15B. In embodiments in which two first word lines 3A are electrically connected to the first gate electrode 15A and the second gate electrode 15B in a unit cell area UC, two second word lines 3B are electrically isolated from the first gate electrode 15A and the second gate electrode 15B in the unit cell area UC. In embodiments in which two second word lines 3B are electrically connected to the first gate electrode 15A and the second gate electrode 15B in a unit cell area UC, two first word lines 3A are electrically isolated from the first gate electrode 15A and the second gate electrode 15B in the unit cell area UC.

In one embodiment, each of the first gate electrode 15A and the second gate electrode 15B may have a width along a channel direction (i.e., the direction of electrical current in the active layer 20), which is the same as the lateral separation direction between neighboring pairs of a source electrode and a drain electrode that are subsequently formed. In one embodiment, the width of each of the first gate electrode 15A and the second gate electrode 15B may be greater than twice the width of each of the word lines 3 along the first horizontal direction hd1.

Referring to FIGS. 8A-8E, a dielectric layer 40 may be deposited over a two-dimensional array of layer stacks of a gate dielectric 10 and an active layer 20. The dielectric layer 40 is also referred to as a thin-film-transistor-level (TFT-level) dielectric layer, i.e., a dielectric layer that is located at the level of thin film transistors. The dielectric layer 40 includes a dielectric material such as undoped silicate glass, a doped silicate glass, organosilicate glass, or a stack thereof. Optionally, the dielectric layer 40 may be planarized to provide a flat top surface. The thickness of the dielectric layer 40, as measured from an interface with the insulating matrix layer 635, may be in a range from 100 nm to 1,000 nm, such as from 200 nm to 500 nm, although lesser and greater thicknesses may also be used.

A photoresist layer 47 may be applied over the dielectric layer 40, and may be lithographically patterned to form discrete openings therein. In one embodiment, three rectangular openings may be formed in the photoresist layer 47 within each unit cell area UC. The three rectangular openings comprise two source openings for defining lateral extents of source electrodes to be subsequently formed within the unit cell area UC, and a drain opening for defining lateral extents of a drain electrode to be subsequently formed within the unit cell area UC.

The pattern of the line trenches and the discrete openings in the photoresist layer 47 may be transferred through the dielectric layer 40 to form source cavities 51 and drain cavities 59. A pair of source cavities 51 may be formed over each active layer 20. Specifically, the pair of source cavities 51 may be formed at end portions of a respective one of the active layers 20 that are laterally spaced apart along the first horizontal direction hd1. The area of each source cavity 51 may be entirely within the area of an underlying active layer 20. A portion of a top surface of an active layer 20 may be physically exposed at the bottom of each source cavity 51. A drain cavity 59 may be formed over each active layer 20 between a respective pair of source cavities 51. A portion of a top surface of an active layer 20 may be physically exposed at the bottom of each drain cavity 59. The photoresist layer 47 may be subsequently removed, for example, by ashing.

Referring to FIGS. 9A-9E, at least one conductive material may be deposited in the cavities (51, 59) and over the dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each top word line 3 may include a gate metallic liner 4 that is a remaining portion of the metallic liner material, and a gate metallic fill material portion 5 that is a remaining portion of the metallic fill material. Generally, a first source electrode 52, a drain electrode 56, and a second source electrode 52 may be formed on a respective portion of a top surface of each active layer 20. The drain electrode 56 is formed between a first source electrode 52 and a second source electrode 52.

Generally, a first transistor and a second transistor may be formed in each unit cell area UC. The first transistor and the second transistor comprise an active layer 20 located over a substrate 8 as a continuous material portion, and a set of electrode structures (52, 15, 56) located on the active layer 20 and may include, from one side to another along a first horizontal direction hd1, a first source electrode 52, a first gate electrode 15A, a drain electrode 56, a second gate electrode 15B, and a second source electrode 52. A first portion of the active layer 20 laterally extending between the first source electrode 52 and the drain electrode 56 may include a first semiconductor channel, and a second portion of the active layer 20 laterally extending between the second source electrode 52 and the drain electrode 56 may include a second semiconductor channel. Top surfaces of the first source electrode 52, the drain electrode 56, and the second source electrode 52 may be located within a horizontal plane (i.e., co-planar) including a top surface of the dielectric layer 40.

Generally, a set of two source electrodes 52 and a drain electrode 56 is formed on each of the active layers 20. A first source electrode 52 contacts a first end portion of the active layer 20, and a second source electrode 52 contacts a second end portion of the active layer 20. A drain electrode 56 contacts a middle portion of the active layer 20. In one embodiment, the separation direction between the first source electrode 52 and the second source electrode 52 may be the same as the first horizontal direction hd1.

Referring to FIGS. 10A-10E, at least one first upper-level dielectric material layer 70 and first upper-level metal interconnect structures (72, 74, 76, 78) may be formed over the dielectric layer 40. The at least one first upper-level dielectric material layer 70 may include a first via-level dielectric material layer having formed therein source contact via structures 72 and drain contact via structures 76, and a first line-level dielectric material layer having embedding first source connection pads 74 and bit lines 78. In this embodiment, the first via-level dielectric material layer may be formed first, and the source contact via structures 72 and the drain contact via structures 76 may be formed through the first via-level dielectric material layer. The first line-level dielectric material layer may be subsequently formed over the first via-level dielectric material layer, and the first source connection pads 74 and the bit lines 78 may be subsequently formed through the first line-level dielectric material layer on a respective one of the source contact via structures 72 and the drain contact via structures 76.

Alternatively, the first via-level dielectric material layer and the first line-level dielectric material layer may be formed as a single dielectric material layer, and a dual damascene process may be performed to form integrated line and via structures. The integrated line and via structures include source-side integrated line and via structures including a respective combination of a source contact via structure 72 and a first source connection pad 74, and drain-side integrated line and via structures including a respective combination of drain contact via structures 76 and a bit line 78 that is integrally formed within the drain contact via structures 76. In one embodiment, each bit line 78 laterally extends along the first horizontal direction hd1 and may be electrically connected to a set of drain electrodes 56 that are arranged along the first horizontal direction hd1.

Generally, source contact via structures 72 may be formed on the source electrodes 52, and drain contact via structure 76 may be formed on the drain electrodes 56. Bit lines 78 may be formed on the drain contact via structure 76 such that each of the bit lines 78 laterally extends along a horizontal direction that is perpendicular to the lengthwise direction of the word lines 3. The bit lines 78 may laterally extend along a horizontal direction (such as the first horizontal direction hd1) that is different from the second horizontal direction hd2. In one embodiment, each of the active layers 20 may have a rectangular horizontal-cross-sectional shape having first sides that are parallel to the first horizontal direction hd1 and having second sides that are parallel to the second horizontal direction hd2.

Referring to FIGS. 11A-11E, at least one second upper-level dielectric material layer 80 and second upper-level metal interconnect structures (82, 84) may be formed over the at least one first upper-level dielectric material layer 70. The at least one second upper-level dielectric material layer 80 may include a second via-level dielectric material layer having formed therein source connection via structures 82, and a second line-level dielectric material layer having formed therein second source connection pads 84. In this embodiment, the second via-level dielectric material layer may be formed, and the source connection via structures 82 may be formed through the second via-level dielectric material layer. The second line-level dielectric material layer may be subsequently formed over the second via-level dielectric material layer, and the second source connection pads 84 may be subsequently formed through the second line-level dielectric material layer on a respective one of the source connection via structures 82.

Alternatively, the second via-level dielectric material layer and the second line-level dielectric material layer may be formed as a single dielectric material layer, and a dual damascene process may be performed to form integrated line and via structures. The integrated line and via structures include source-side integrated line and via structures including a respective combination of a source connection via structure 82 and a second source connection pad 84.

Generally, upper-level dielectric material layers (70, 80) may be formed over the dielectric layer 40. Source-connection metal interconnect structures (72, 74, 82, 84) may be formed within the upper-level dielectric material layers (70, 80), which may be used to electrically connect each of the source electrodes 52 to a conductive node of a respective capacitor structure to be subsequently formed. Within each unit cell area UC, first source-connection metal interconnect structures (72, 74, 82, 84) may be used to provide electrical connection between a first source electrode 52 to a first conductive node of a first capacitor structure to be subsequently formed, and second source-connection metal interconnect structures (72, 74, 82, 84) may be used to provide electrical connection between a second source electrode 52 and a second conductive node of a second capacitor structure to be subsequently formed.

Referring to FIGS. 12A-12E, capacitor structures 98 may be formed within a capacitor-level dielectric material layer 90. For example, source-side plates 92 (also referred to as first capacitor plates) may be formed on top surfaces of the second source connection pads 84 by deposition and patterning a first conductive material, which may be a metallic material or a heavily doped semiconductor material. Optionally, a dielectric etch stop layer 89 may be formed on a top surface of the second upper-level dielectric material layer 80. A node dielectric 94 may be formed on each source-side plate 92 by deposition of a node dielectric material such as silicon oxide and/or a dielectric metal oxide (e.g., aluminum oxide, lanthanum oxide, and/or hafnium oxide). A ground-side plate 96 (also referred to as a second capacitor plate) may be formed on physically exposed surfaces of the node dielectric by deposition and patterning of a second conductive material, which may be a metallic material or a heavily doped semiconductor material. It is noted that the area of the unit cell area UC has been shifted at the level of the capacitor structures 98 relative to the area of the unit cell area UC at the levels of the upper-level dielectric material layers (70, 80) so that each unit cell area UC includes a pair of an entirety of capacitor structures 98 as contiguous structures. The two-dimensional periodicity of the unit cell area UC is the same irrespective of the levels at which the area of the unit cell area UC is defined.

Each contiguous combination of a source-side plate 92, a node dielectric 94, and a ground-side plate 96 may constitute a capacitor structure 98. A pair of capacitor structures 98 may be formed within each unit cell area UC. Thus, a first capacitor structure 98 and a second capacitor structure 98 may be formed within each unit cell area UC. A first conductive node (such as a source-side plate 92) of the first capacitor structure 98 is electrically connected to an underlying first source electrode 52, and a second conductive node (such as another source-side plate 92) of the second capacitor structure 98 is electrically connected to an underlying second source electrode 52.

Generally, the field effect transistors 701 located on the substrate 8 may be electrically connected to the various nodes of the transistors formed within the dielectric layer 40. A subset of the field effect transistors 701 may be electrically connected to at least one of the drain electrodes 56, the first gate electrodes 15A, and the second gate electrodes 15B. A bottom surface of a first conductive node of a first capacitor structure 98 may contact a top surface of a respective one of the first source-connection metal interconnect structures (72, 74, 82, 84). A bottom surface of a second conductive node of a second capacitor structure 98 may contact a top surface of a respective one of the second source-connection metal interconnect structures (72, 74, 82, 84).

The capacitor-level dielectric material layer 90 may be formed over the capacitor structures 98. Each of the capacitor structures 98 may be formed within, and laterally surrounded by, the capacitor-level dielectric material layer 90, which is one of the upper-level dielectric material layers (70, 80, 90).

In one embodiment, each of the source-side plates 92 may be electrically connected to (i.e., electrically shorted to) a respective one of the source electrodes 52. Each of the ground-side plates 96 may be electrically grounded, for example, by forming an array of conductive via structures (not shown) that contact the ground-side plates 96 and connected to an overlying metallic plate (not shown). Generally, capacitor structures 98 may be formed over a horizontal plane including a top surface of the bit lines 78. Each of the capacitor structures 98 comprise a node that is electrically connected to a respective one of the source electrodes 52.

A unit cell structure is formed within a volume that is laterally confined by the unit cell area UC. The first exemplary structure may include a two-dimensional array of unit cell structures. In one embodiment, each unit cell structure within the two-dimensional array of unit cell structures may include: a first capacitor structure 98 including a first source-side plate 92 that is electrically connected to the first source electrode 52; and a second capacitor structure 98 including a second source-side plate 92 that is electrically connected to the second source electrode 52.

In one embodiment, each unit cell structure within the two-dimensional array of unit cell structures may include: a first source-side metal interconnect structure (72, 74, 82, 84) including at least one first conductive via structure (72, 82) and providing electrical connection between the first source electrode 52 and the first source-side plate 92; and a second source-side metal interconnect structure (72, 74, 82, 84) including at least one second conductive via structure (72, 82) and providing electrical connection between the second source electrode 52 and the second source-side plate 92.

In one embodiment, each unit cell structure within the two-dimensional array of unit cell structures may include a drain contact via structure 76 contacting a top surface of the drain electrode 56 and contacting a bottom surface of a respective one of the bit lines 78. In one embodiment, field effect transistors 701 may underlie the at least four word lines 3 within each unit cell structure. The field effect transistors 701 may comprise a respective portion of the substrate (which may include a single crystalline semiconductor material) as a respective channel region.

Figure 13:
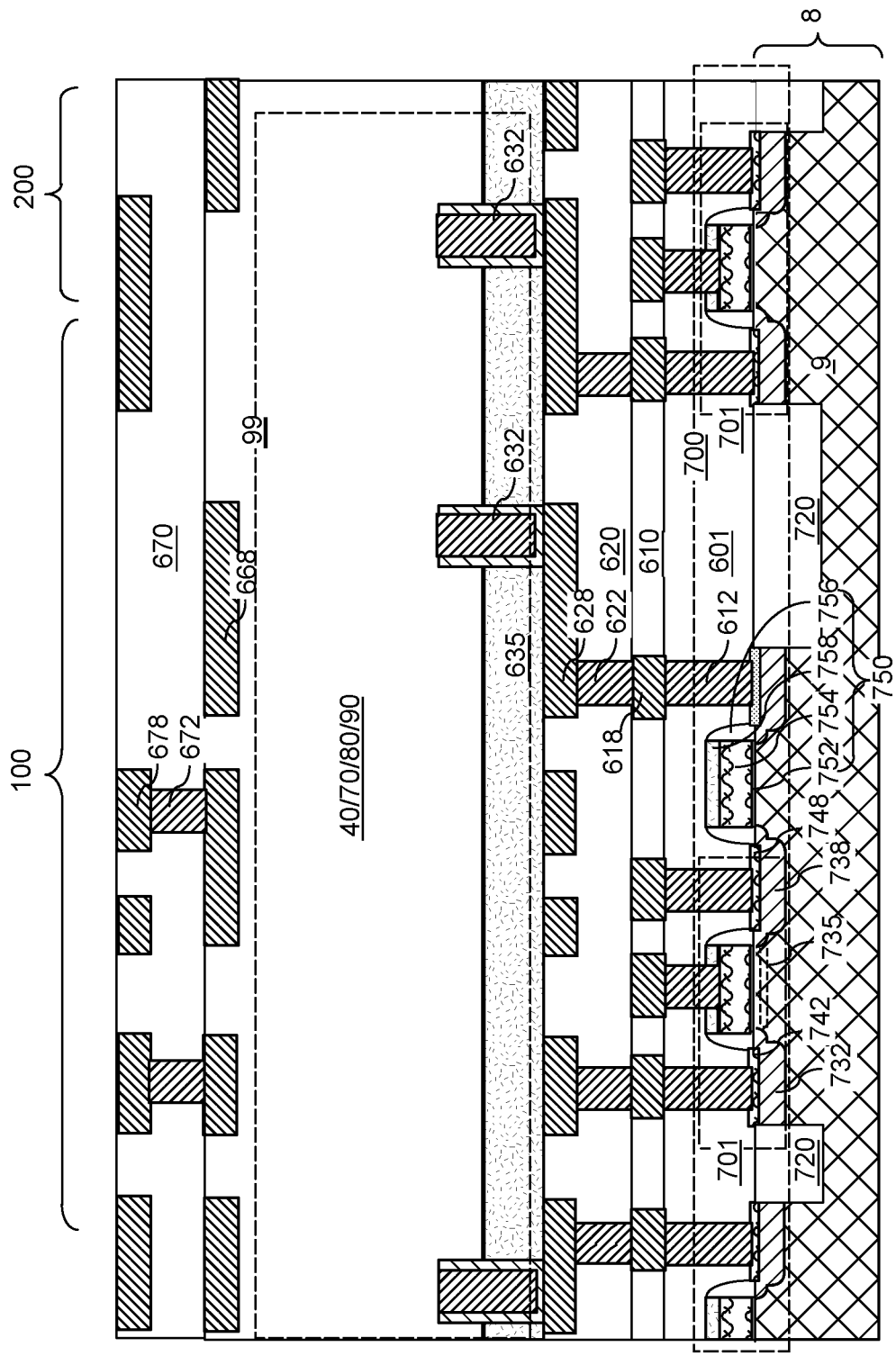
FIG. 13 is a vertical cross-sectional view of the first exemplary structure after formation of additional upper-level dielectric material layers and additional upper-level metal interconnect structures according to the first embodiment of the present disclosure.

Referring to FIG. 13, the first exemplary structure is illustrated after formation of a two-dimensional array of memory cells 99 over the insulating matrix layer 635. Various additional metal interconnect structures (632, 668) may be formed in the insulating matrix layer 635, the dielectric layer 40, and the upper-level dielectric material layers (70, 80, 90). The additional metal interconnect structures (632, 668) may include, for example, second metal via structures 632 that may be formed through the insulating matrix layer 635 and the dielectric layer 40 on a top surface of a respective one of the second metal line structures 628. Further, the additional metal interconnect structures (632, 668) may include, for example, metal line structures that are formed in upper portions of the capacitor-level dielectric material layer 90, which are herein referred to as sixth metal line structures 668.

Additional interconnect-level dielectric material layer and additional metal interconnect structures may be subsequently formed. For example, a seventh interconnect-level dielectric material layer 670 embedding seventh metal line structures 678 and sixth metal via structures 672 may be formed above the capacitor-level dielectric material layer 90. While the present disclosure is described using an embodiment in which seven levels of metal line structures are used, embodiments are expressly contemplated herein in which a lesser or greater number of interconnect levels are used.

Figure 14:
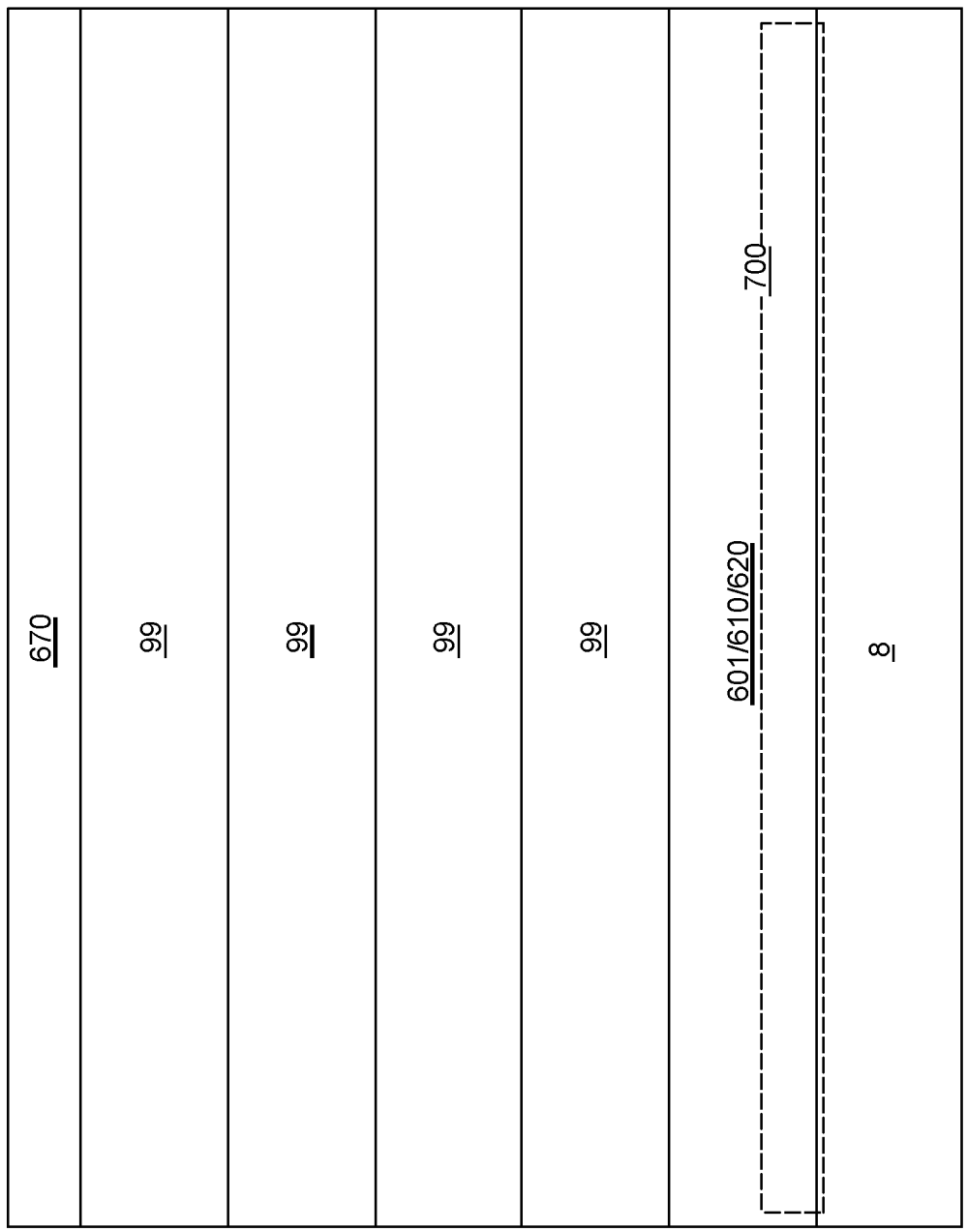
FIG. 14 is a vertical cross-sectional view of an alternative configuration of the first exemplary structure according to the first embodiment of the present disclosure.

Referring to FIG. 14, an alternative configuration of the first exemplary structure according to the first embodiment of the present disclosure may be derived from the first exemplary structure illustrated in FIG. 13 by vertically stacking multiple two-dimensional arrays of memory cells 99. While a configuration in which four two-dimensional arrays of memory cells 99 are vertically stacked is illustrated in FIG. 14, additional configurations are expressly contemplated herein in which two, three, five, or more two-dimensional arrays of memory cells 99 are vertically stacked.

Figure 12A:
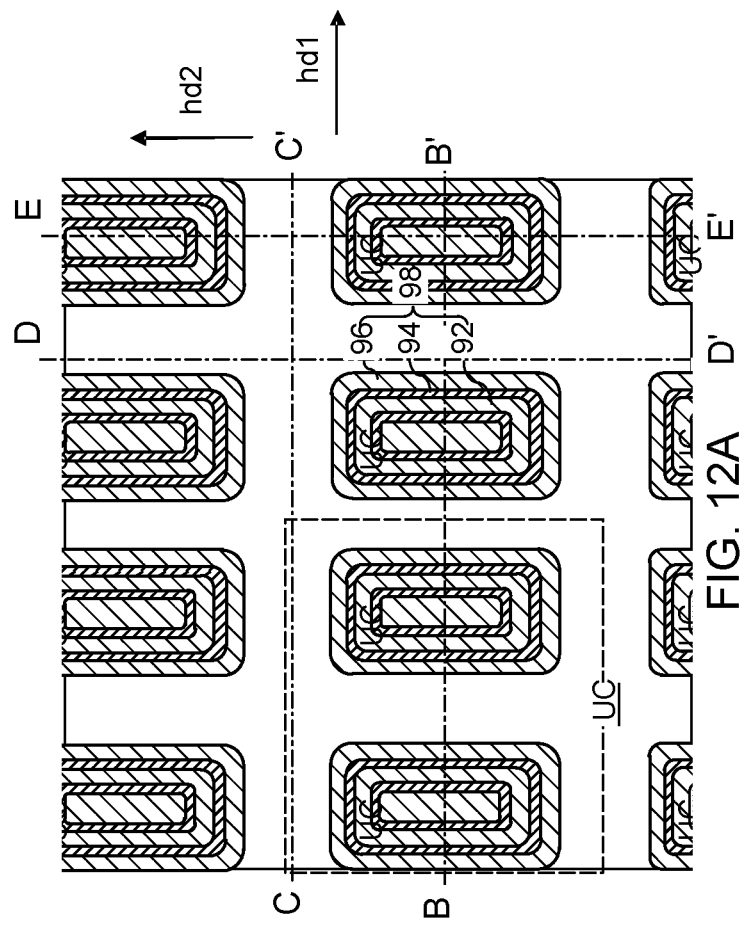
Figure 15B:
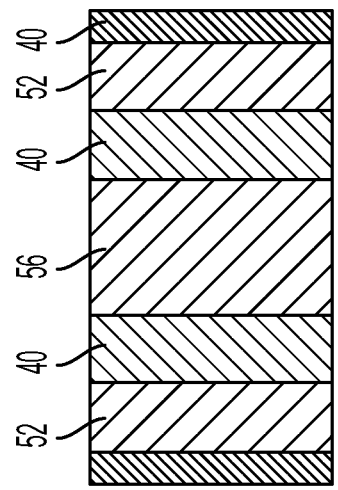
FIG. 15B is a horizontal cross-sectional view along the horizontal plane B-B' in FIG. 15A.
Figure 15A:
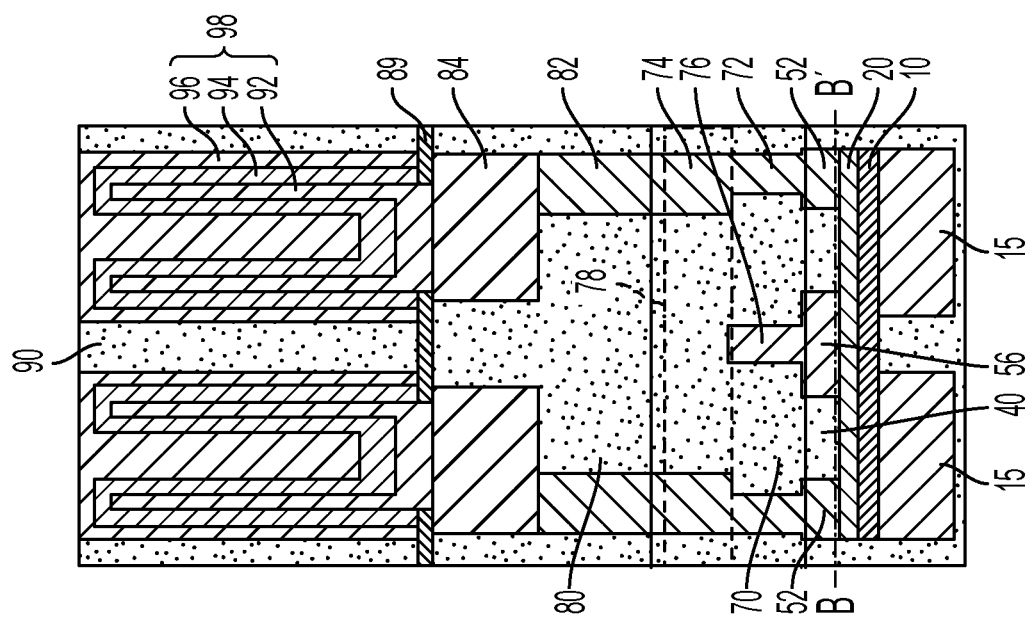
FIG. 15A is a schematic vertical cross-sectional view of a portion of a unit cell within a two-dimensional array of unit cells within the first exemplary structure according to the first embodiment of the present disclosure.
Figure 16A:
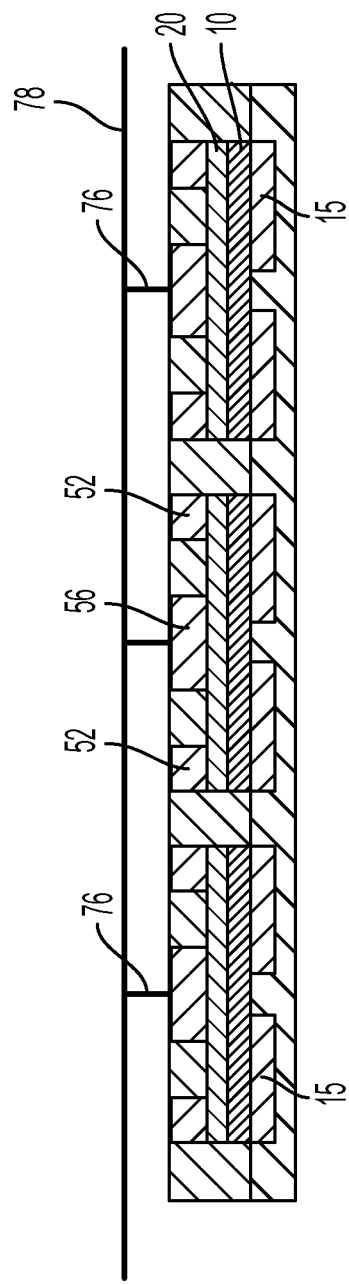
FIG. 16A is a schematic vertical cross-sectional view of a portion of the first exemplary structure according to the first embodiment of the present disclosure.
Figure 16B:
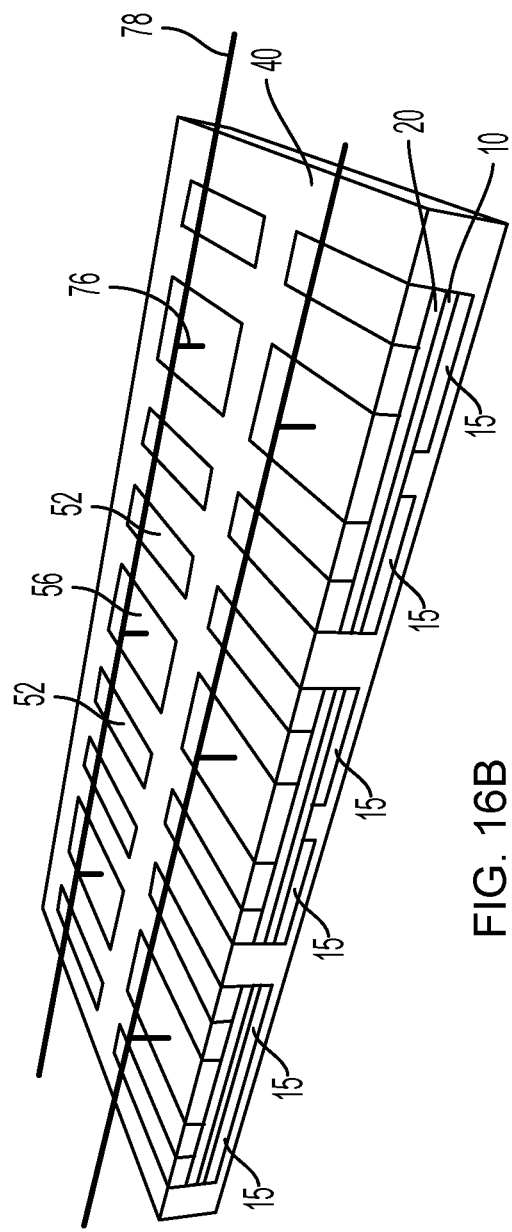
FIG. 16B is a schematic perspective view of the portion of the first exemplary structure of FIG. 16A.
Figure 17B:
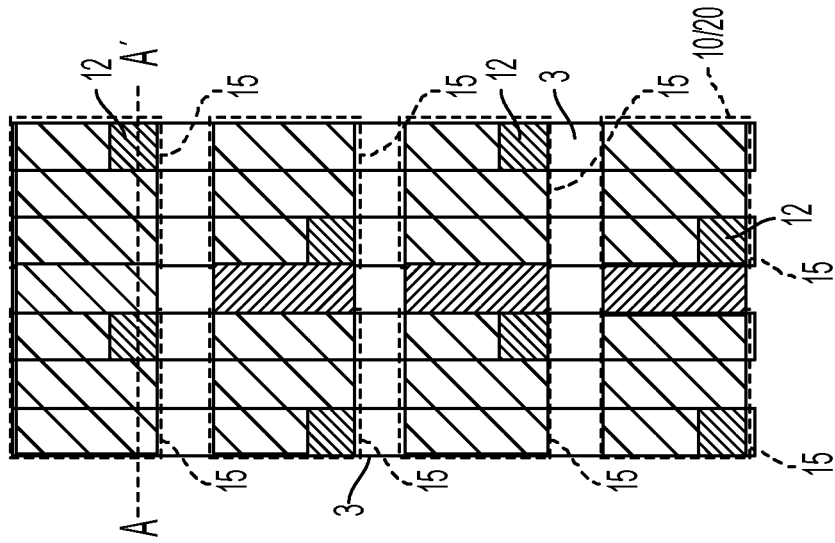
FIG. 17B is a first plan view of the portion of the first exemplary structure in FIG. 17A in which a first subset of structural elements is illustrated. The vertical cross-sectional plane A-A' is the plane of the vertical cross-sectional view of FIG. 17A.
Figure 17A:
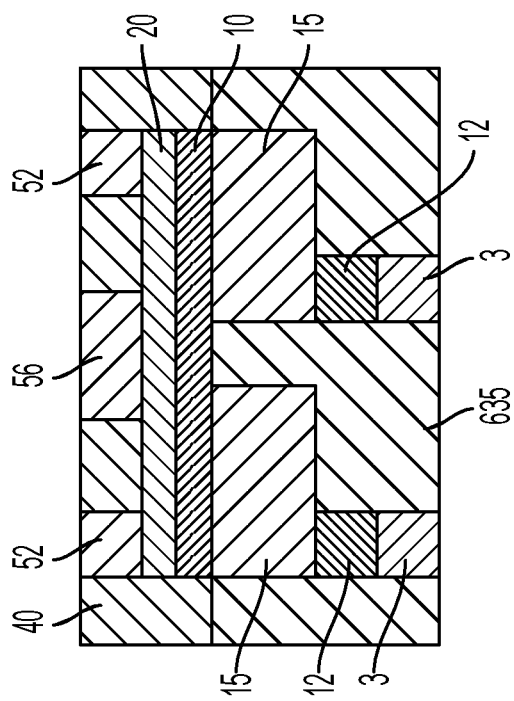
FIG. 17A is a schematic vertical cross-sectional view of a portion of the first exemplary structure according to the first embodiment of the present disclosure.
Figure 18:
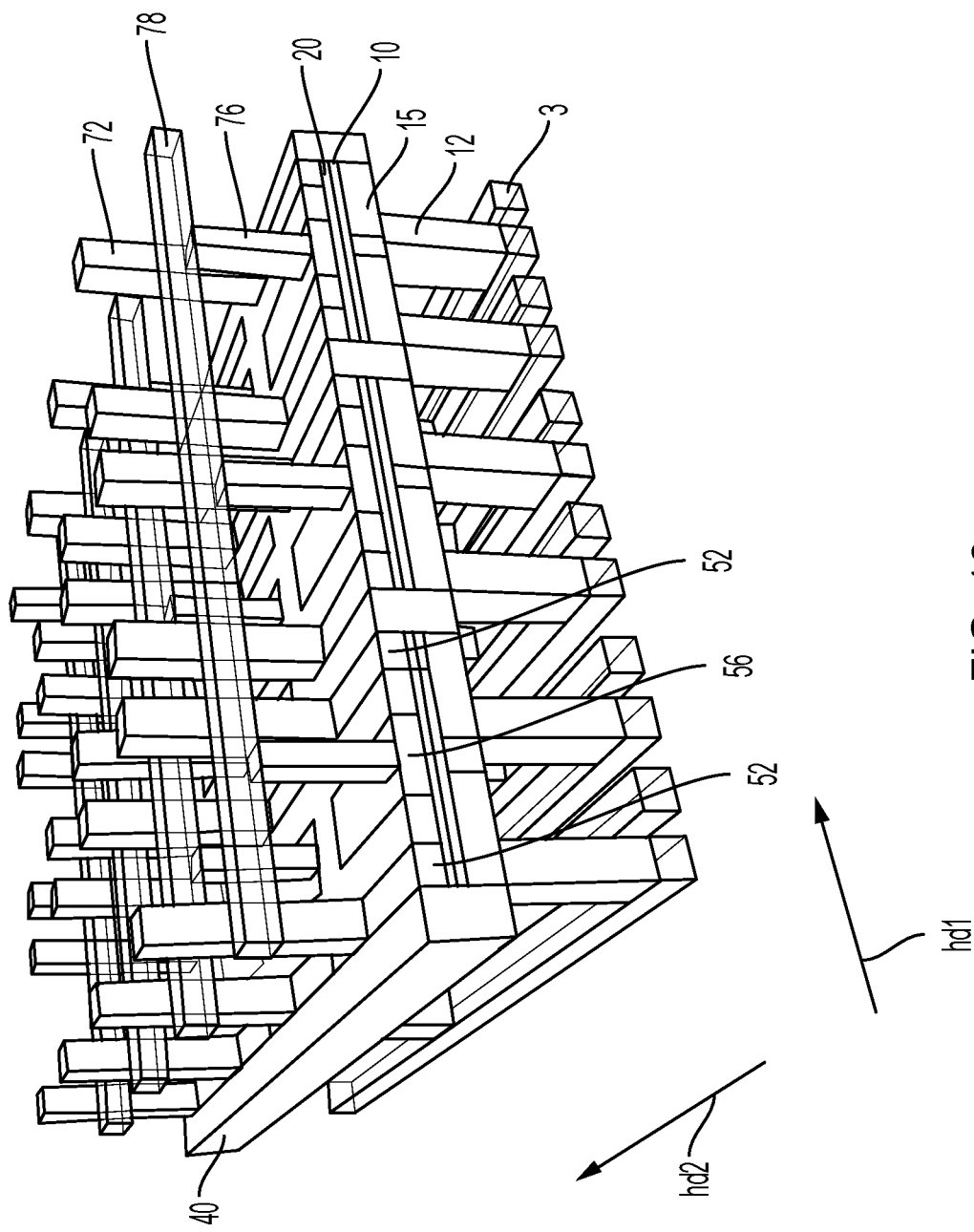
FIG. 18 is a perspective view of a region of the first exemplary structure according to the first embodiment of the present disclosure.
Figure 19A:
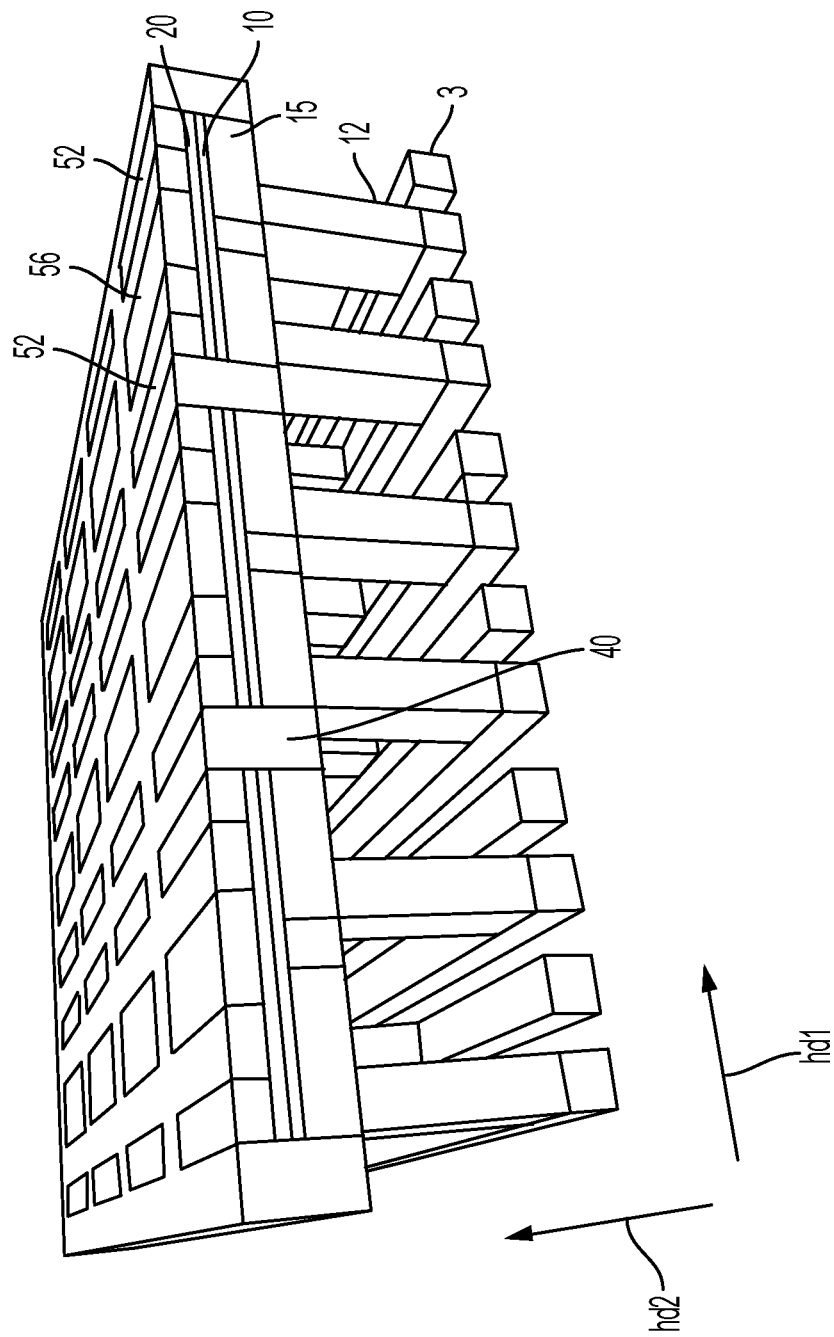
FIGS. 19A-19C are perspective views of a region of the first exemplary structure according to the first embodiment of the present disclosure.
Figure 19B:
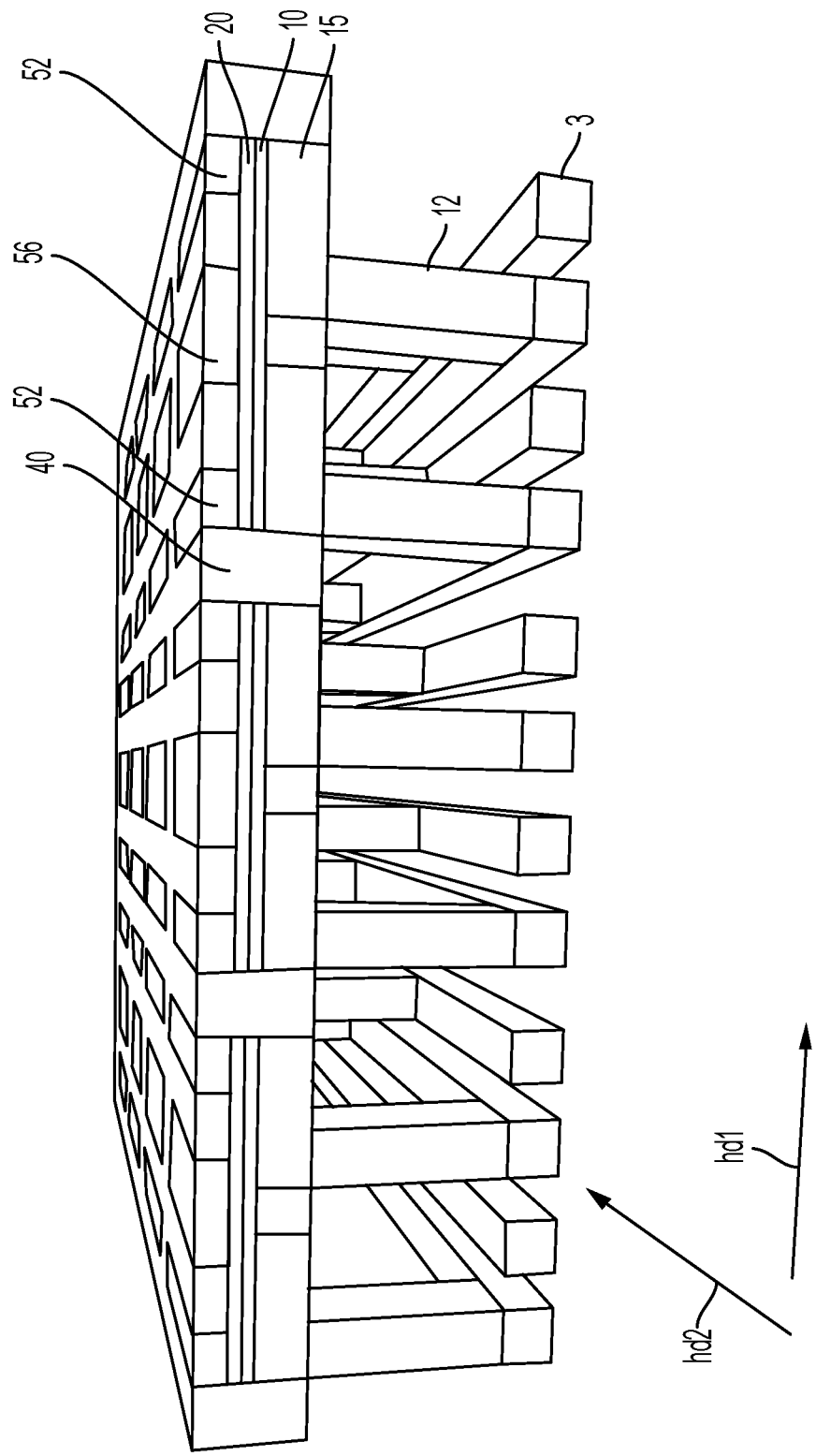
Figure 19C:
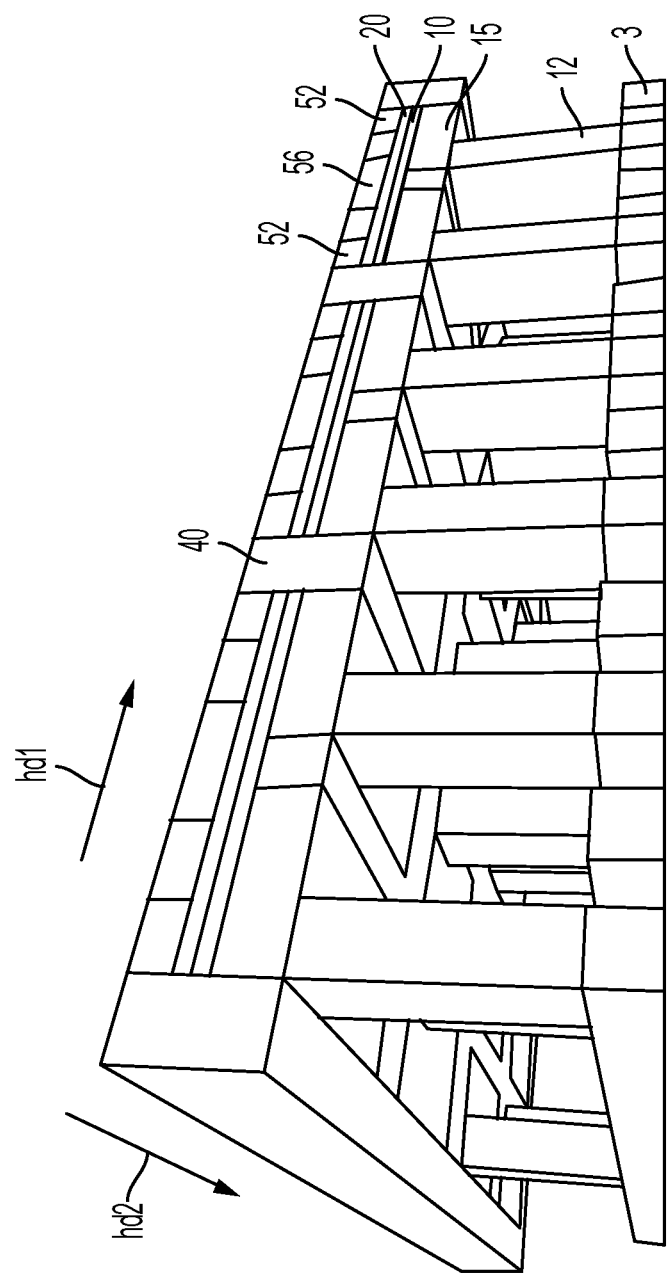

Various additional view of the first exemplary structure of FIGS. 12A-12C are illustrated in FIGS. 15A, 15B, 16A, 16B, 17A-17C, 18, and 19A-19C. FIG. 15A is a schematic vertical cross-sectional view of a portion of a unit cell within a two-dimensional array of unit cells within the first exemplary structure according to the first embodiment of the present disclosure. FIG. 15B is a horizontal cross-sectional view along the horizontal plane B-B' in FIG. 15A. FIG. 16A is a schematic vertical cross-sectional view of a portion of the first exemplary structure according to the first embodiment of the present disclosure. FIG. 16B is a schematic perspective view of the portion of the first exemplary structure of FIG. 16A. FIG. 17A is a schematic vertical cross-sectional view of a portion of the first exemplary structure according to the first embodiment of the present disclosure. FIG. 17B is a first plan view of the portion of the first exemplary structure in FIG. 17A in which a first subset of structural elements is illustrated. The vertical cross-sectional plane A-A' is the plane of the vertical cross-sectional view of FIG. 17A. FIG. 17C is a first plan view of the portion of the first exemplary structure in FIG. 17A in which a second subset of structural elements is illustrated. The vertical cross-sectional plane A-A' is the plane of the vertical cross-sectional view of FIG. 17A. FIG. 18 is a perspective view of a region of the first exemplary structure according to the first embodiment of the present disclosure. FIGS. 19A-19C are perspective views of a region of the first exemplary structure according to the first embodiment of the present disclosure.

Figure 20:
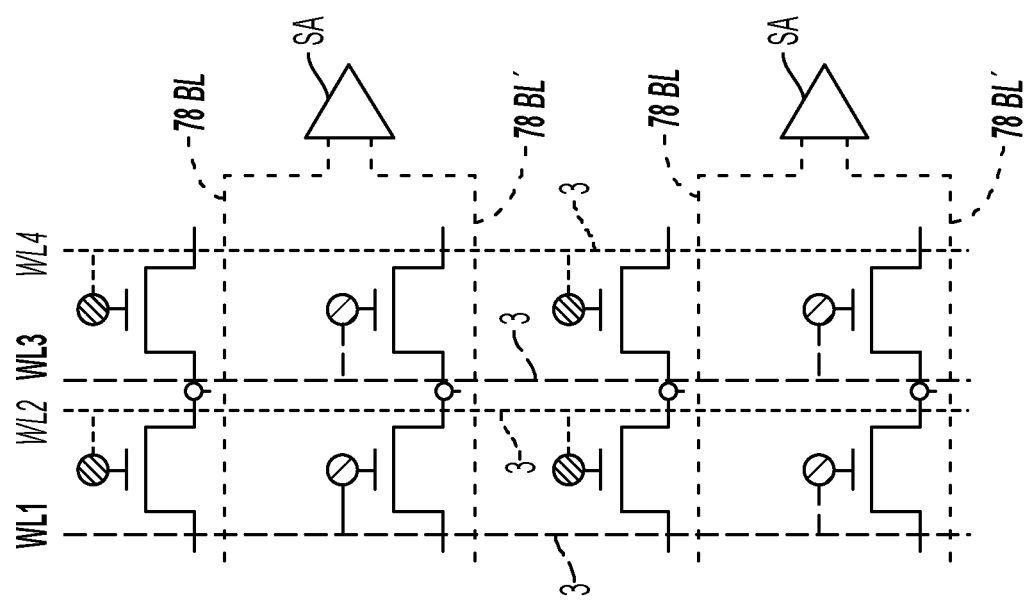
FIG. 20 is a circuit schematic of a portion of the first exemplary structure according to the first embodiment of the present disclosure.
Figure 21A:
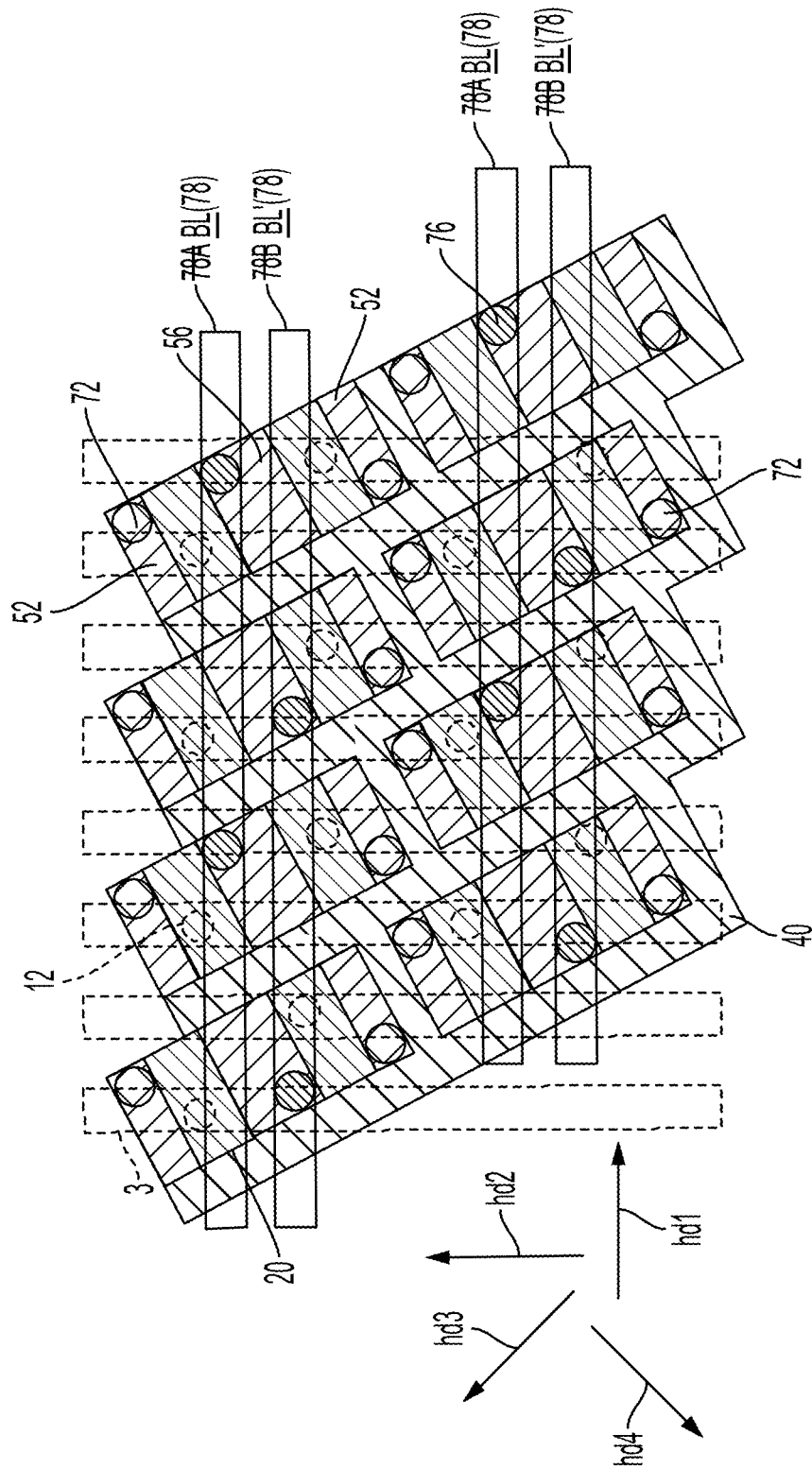
FIG. 21A is a plan view of a portion of a second exemplary structure according to a second embodiment of the present disclosure.
Figure 21B:
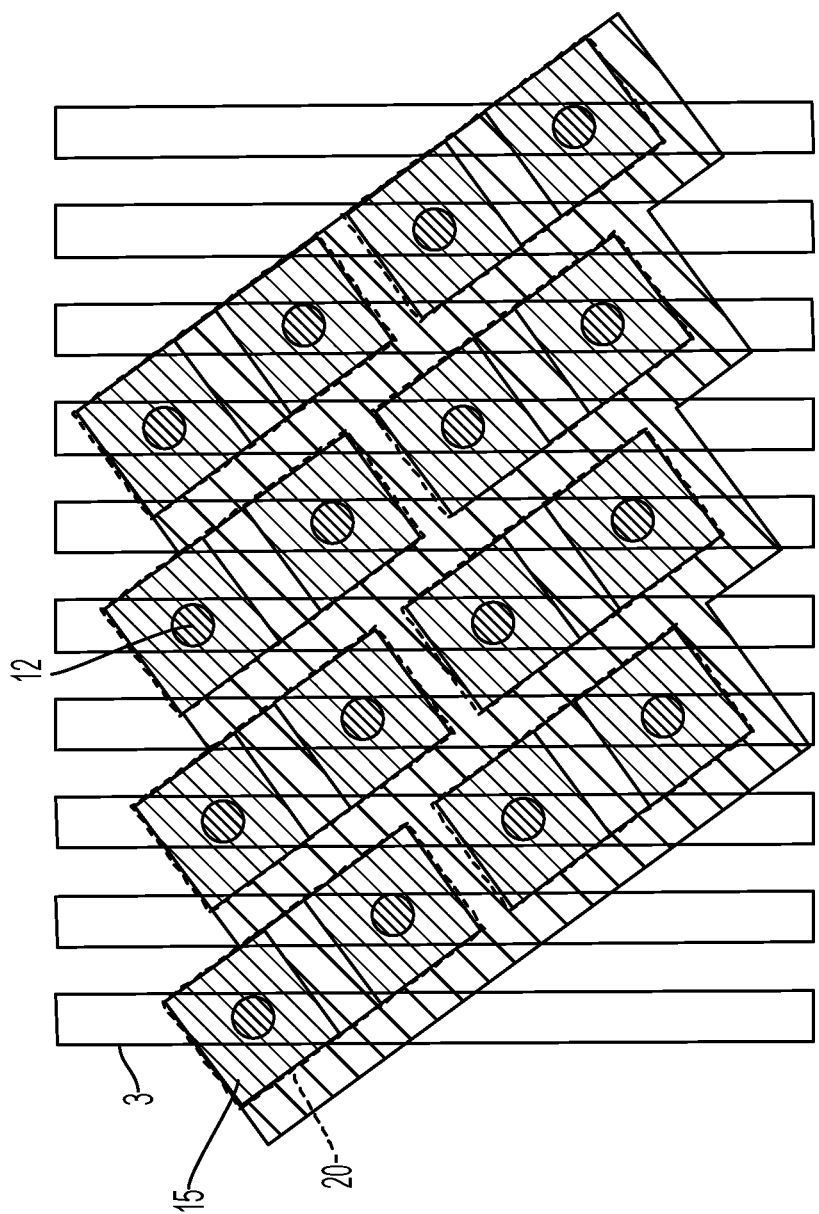
FIG. 21B is a plan view of a subset of components of the second exemplary structure at levels of the word lines, the word-line-connection via structures, and the gate electrodes according to the second embodiment of the present disclosure.
Figure 22A:
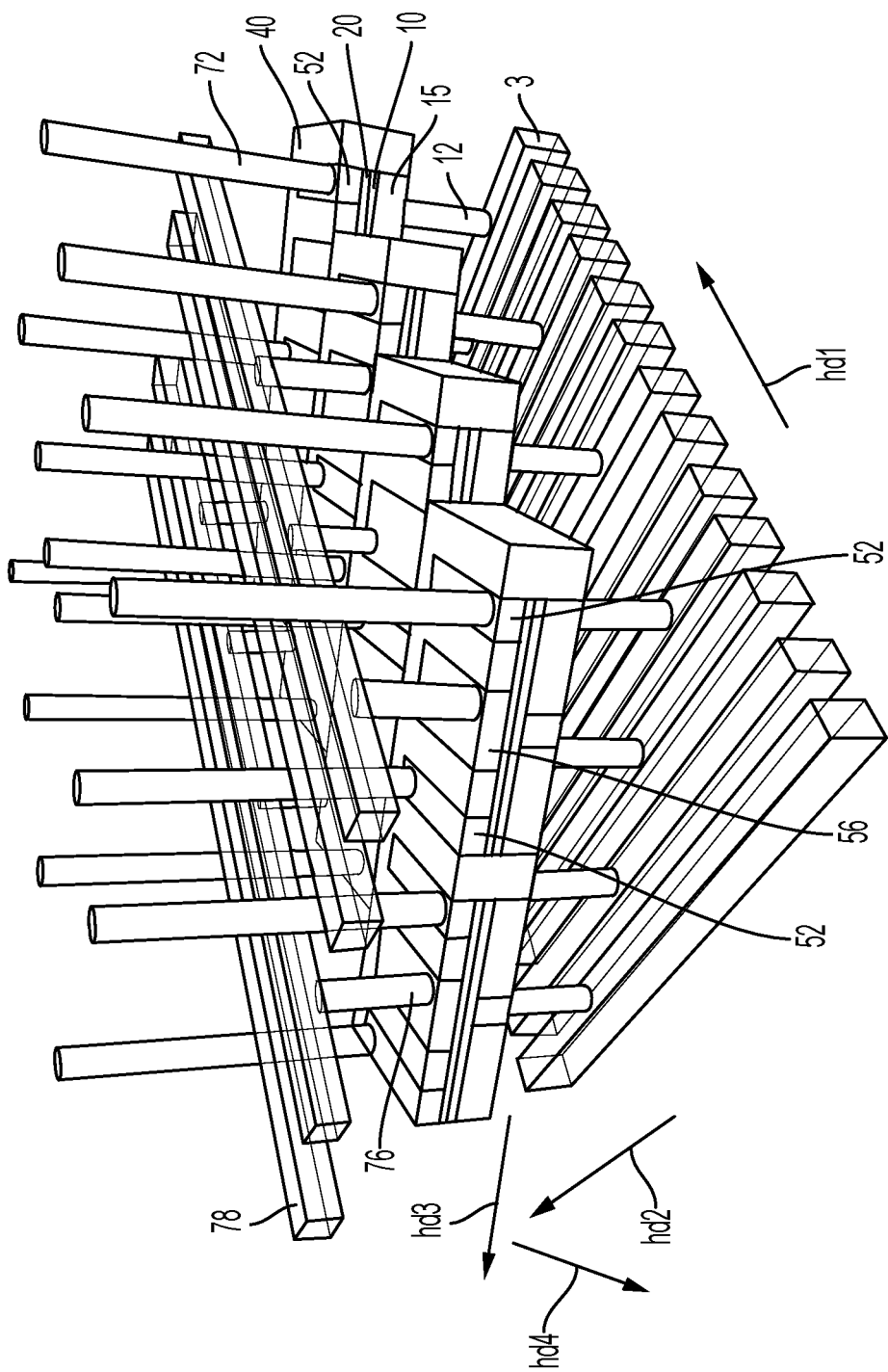
FIGS. 22A-22C are perspective views of a region of the second exemplary structure according to the second embodiment of the present disclosure.
Figure 22B:
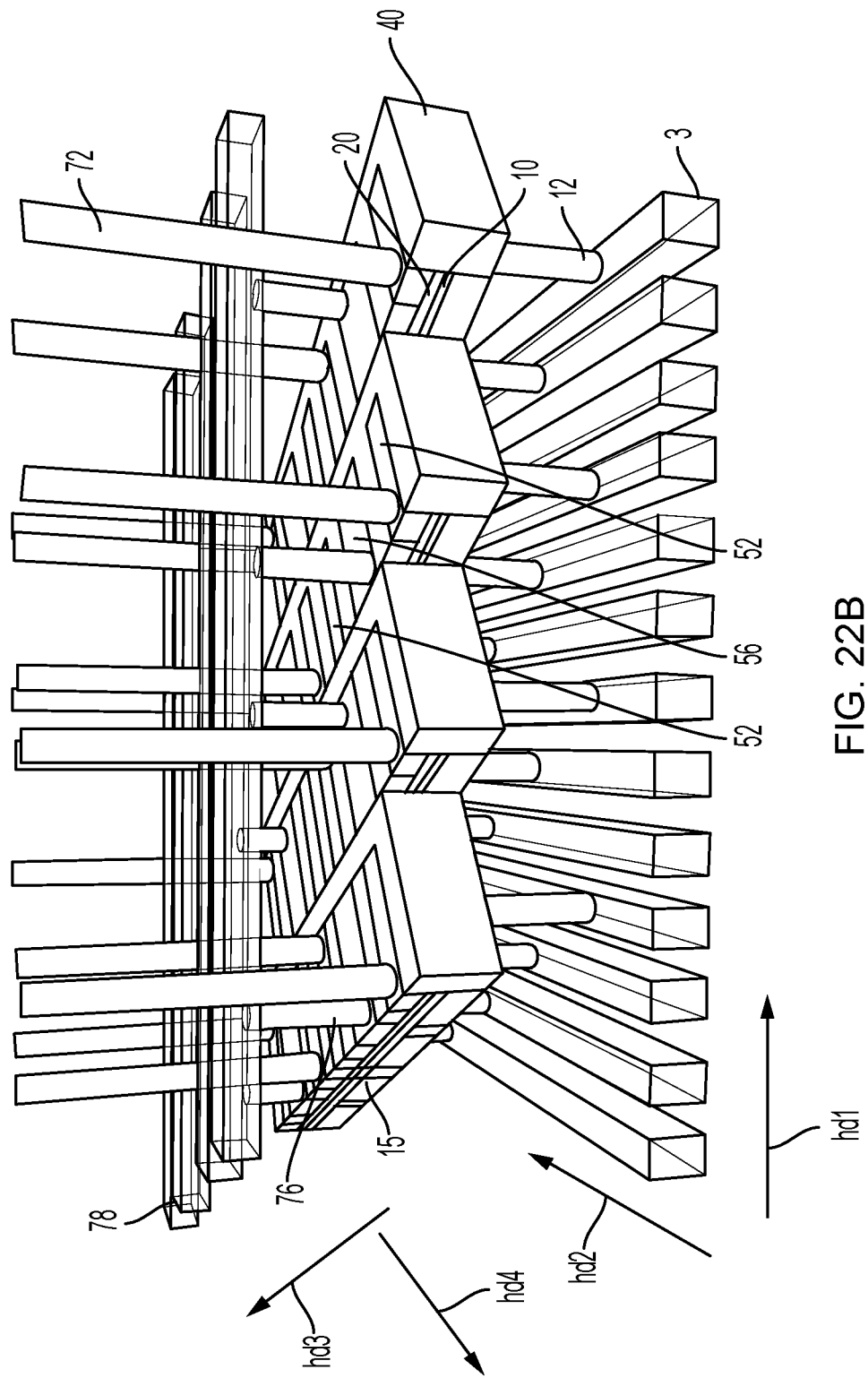
Figure 22C:
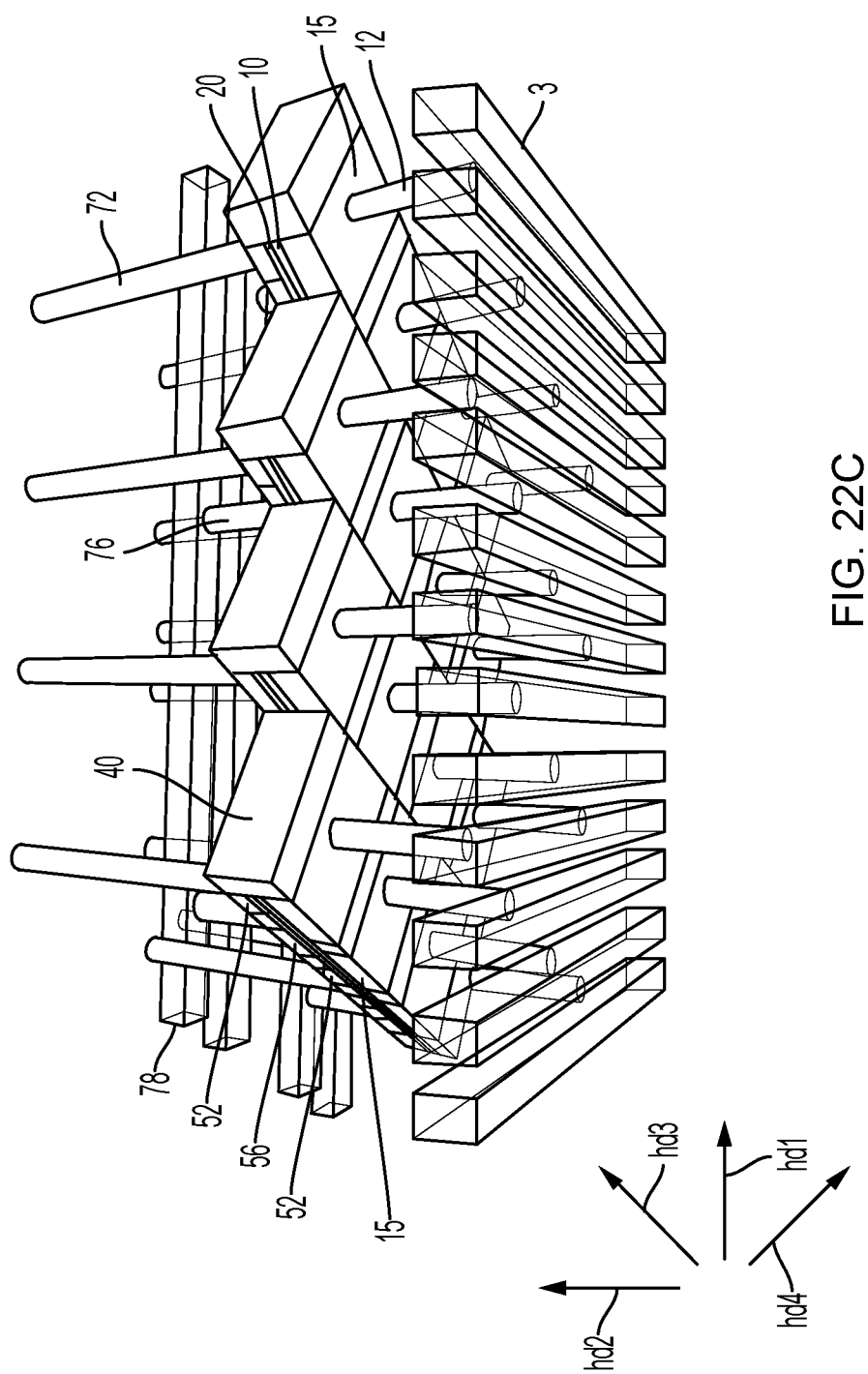

Referring to FIG. 20, a circuit schematic of a portion of the first exemplary structure is illustrated according to the first embodiment of the present disclosure. The circuit schematic illustrates eight thin film transistors formed within four adjacent unit cell areas UC that are arranged along the second horizontal direction hd2 in the above-described first exemplary structures. A pair of bit lines (BL, BL') (which include a pair of bit lines 78 in the above-described first exemplary structures) may be connected to a sense amplifier SA. Each word line (WL1, WL2, WL3, WL4) may be connected to gate electrodes 15 of every other transistor along the lengthwise direction of the word lines (WL1, WL2, WL3, WL4). With respect to the four word lines, word line WL1 and word line WL3 correspond to the first word lines 3A, and word line WL2 and word line WL4 correspond to the second word lines 3B.

The pair of bit lines (BL, BL') comprise a primary bit line BL and a complementary bit line BL'. During sensing of each memory cell connected to the primary bit line BL, the complementary bit line BL' functions as a reference bit line. During sensing of each memory cell connected to the complementary bit line BL', the primary bit line BL functions as a reference bit line. The folded bit line configuration illustrated in FIG. 20 enhances noise immunity of the array of memory cells, and increases the signal-to-noise ratio of the array of memory cells during sensing since most of the noises that are present during sensing are common mode noises.

Referring to FIGS. 21A, 21B, and 22A-22C, a second exemplary structure according to a second embodiment of the present disclosure is illustrated. The second exemplary structure may be derived from the first exemplary structure by azimuthally rotating elements between a first horizontal plane including the bottom surfaces of the gate electrodes 15 and a second horizontal plane including the top surfaces of the source electrodes 52 and the drain electrodes 56 around a vertical axis that is perpendicular to the top surface of the substrate (not shown in FIGS. 21A, 21B, and 22A-22C) by a rotation angle that is not a multiple of $\pi/2$ (i.e., 90 degrees). In other words, the rotation angle may be greater than 0 degree and less than 90 degrees, greater than 90 degrees and less than 180 degrees, greater than 180 degrees and less than 270 degrees, or greater than 270 degrees and less than 360 degrees. In one embodiment, the rotation angle may be in a range from 1 degree to 89 degrees, in a range from 91 degrees to 179 degrees, in a range from 181 degrees to 269 degrees, or in a range from 271 degrees to 359 degrees. In one embodiment, the rotation angle may be in a range from 5 degrees to 85 degrees, in a range from 95 degrees to 175 degrees, in a range from 185 degrees to 265 degrees, or in a range from 275 degrees to 355 degrees. In one embodiment, the rotation angle may be in a range from 10 degrees to 80 degrees, in a range from 100 degrees to 170 degrees, in a range from 190 degrees to 260 degrees, or in a range from 280 degrees to 350 degrees. In one embodiment, the rotation angle may be in a range from 20 degrees to 70 degrees, in a range from 110 degrees to 160 degrees, in a range from 200 degrees to 250 degrees, or in a range from 290 degrees to 340 degrees. In one embodiment, the rotation angle may be in a range from 30 degrees to 60 degrees, in a range from 120 degrees to 150 degrees, in a range from 210 degrees to 240 degrees, or in a range from 300 degrees to 330 degrees.

The locations of the word-line-connection via structures 12 may be rearranged mutatis mutandis to provide electrical connections between the word lines 3 and the gate electrodes 15. The electrical connections between the word lines 3 and the gate electrodes 15 may have the same circuit schematics as in the first exemplary structure. The locations of the source contact via structures 72 and the drain contact via structures 76 may be rearranged mutatis mutandis to provide electrical connections between the source electrodes 52 and the source connection pads (not shown in FIGS. 21A, 21B, and 22A-22C) and between the drain electrodes 56 and the bit lines 78. The electrical connections between the source electrodes 52 and the source connection pads may have the same circuit schematics as in the first exemplary structure. The electrical connections between the drain electrodes 56 and the bit lines 78 may have the same circuit schematics as in the first exemplary structure. The bit lines 78 may comprise first bit lines 78A and second bit lines 78B.

In some embodiments, the source contact via structures 72 may be vertically elongated. In this embodiment, the source connection pads 74 and the source connection via structures 82 may be omitted, and the second source connection pads (not shown in FIGS. 21A, 21B, and 22A-22C) may be formed directly on top surfaces of the source contact via structures 72.

Generally, a gate dielectric layer 10C and a semiconductor material layer (such as a continuous active layer 20C) may be deposited over the gate electrodes 15. The semiconductor material layer and the gate dielectric layer 10C may be patterned into the two-dimensional array of layer stacks (10, 20). Each of the layer stacks (10, 20) may comprise a gate dielectric 10 and an active layer 20. In one embodiment, each of the active layers 20 may include two sidewalls that are not perpendicular to, and not parallel to, a lengthwise direction of the word lines 3 (such as the second horizontal direction hd2) and two additional sidewalls that are perpendicular to the two sidewalls. In one embodiment, each of the active layers 20 may have a rectangular horizontal cross-sectional shape having two pairs of parallel sides that are not parallel to, and are not perpendicular to, the first horizontal direction hd1 or the second horizontal direction hd2. The two pairs of parallel sides may include two first sides that are parallel to each other and two second sides that are parallel to each other and perpendicular to the two first sides. In one embodiment, the bit lines 78 may laterally extend along the first horizontal direction hd1, and the word lines 3 may laterally extend along the second horizontal direction hd2. In one embodiment, the second horizontal direction hd2 may be perpendicular to the first horizontal direction hd1.

In one embodiment, the separation direction between the first source electrode 52 and the second source electrode 52 (i.e., the channel direction that is the direction of current flow within the active layer 20) is not parallel to the first horizontal direction hd1 and is not parallel to the second horizontal direction hd2.

In one embodiment, the active layers 20 within the two-dimensional array of unit cell structures are arranged with a first periodicity along a third horizontal direction hd3 that is not parallel to the first horizontal direction hd1 and not parallel to the second horizontal direction hd2 and with a second periodicity along a fourth horizontal direction hd4 that is perpendicular to the third horizontal direction hd3.

Figure 23:
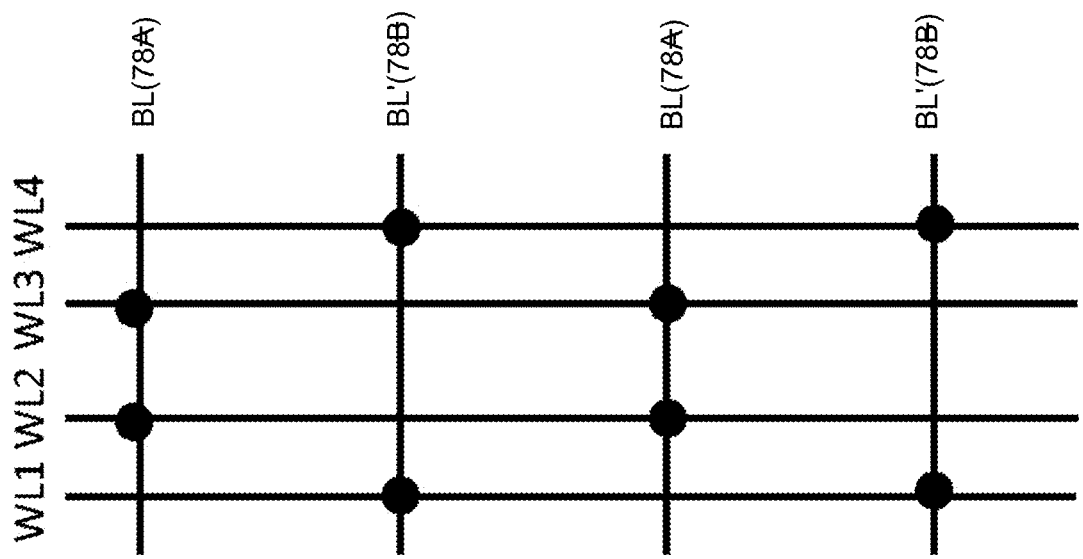
FIG. 23 is a schematic diagram illustrating a configuration for word lines and bit lines in the first and second exemplary structures according to embodiments of the present disclosure.

Referring to FIG. 23, a schematic diagram illustrates a configuration for word lines (WL1, WL2, WL3, WL4) and bit lines (BL, BL') in the first and second exemplary structures according to embodiments of the present disclosure. The folded bit line configuration uses electrical connection of each word line 3 to every other gate electrode 15 along the lengthwise direction of the word lines 3, and thus, may provide enhanced signal-to-noise ratio.

Figure 24:
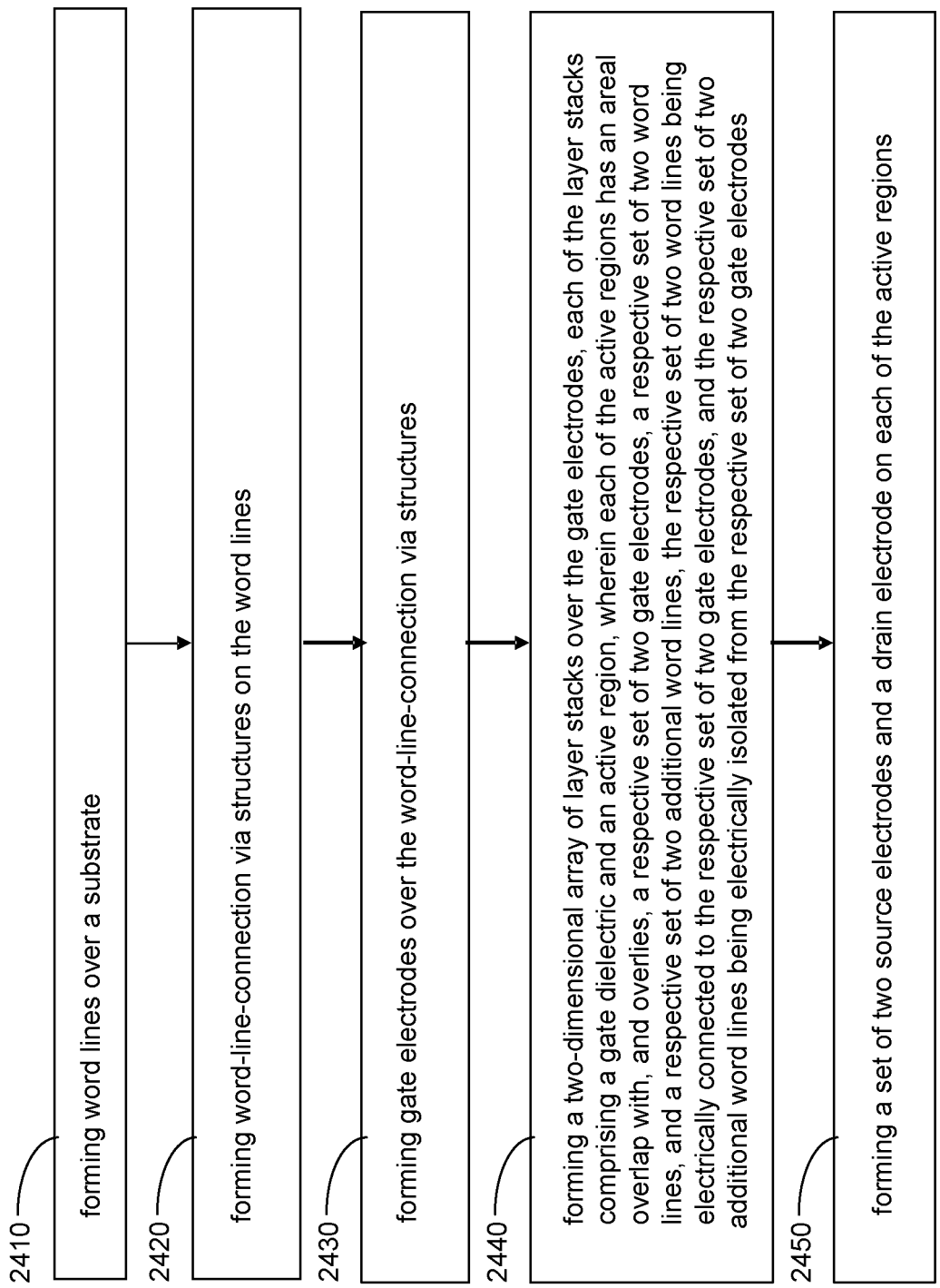
FIG. 24 is a flowchart that illustrates the general processing steps for manufacturing the semiconductor devices of the present disclosure.

Referring to FIG. 24, a flowchart illustrates the general processing steps for manufacturing the semiconductor devices of the present disclosure.

Referring to step 2410 and FIGS. 1, 2A-2E, 3A-3E, 21A, 21B, and 22A-22C, word lines 3 are formed over a substrate 8.

Referring to step 2420 and FIGS. 4A-4E, 21A, 21B, and 22A-22C, word-line-connection via structures 12 are formed on the word lines 3.

Referring to step 2430 and FIGS. 5A-5E, 21A, 21B, and 22A-22C, gate electrodes 15 are formed over the word-line-connection via structures 12.

Referring to step 2440 and FIGS. 6A-6E, 7A-7E, 21A, 21B, and 22A-22C, a two-dimensional array of layer stacks (10, 20) may be formed over the gate electrodes 15. Each of the layer stacks (10, 20) may include a gate dielectric 10 and an active layer 20. Each of the active layers 20 has an areal overlap with, and overlies, a respective set of two gate electrodes (15A, 15B), a respective set of two word lines (3A or 3B), and a respective set of two additional word lines (3B or 3A). The respective set of two word lines (3A or 3B) may be electrically connected to the respective set of two gate electrodes (15A, 15B), and the respective set of two additional word lines (3B or 3A) may be electrically isolated from the respective set of two gate electrodes (15A, 15B).

Referring to step 2450 and FIGS. 8A-19C, 21A and 21B, and 22A-22C, a set of two source electrodes 52 and a drain electrode 56 may be formed on each of the active layers 20.

Referring to all drawings and according to various embodiments of the present disclosure, a semiconductor structure may include a two-dimensional array of unit cell structures overlying a substrate 8 is provided. Each unit cell structure within the two-dimensional array of unit cell structures may include: an active layer 20 that includes a semiconductor material; a gate dielectric 10 underlying the active layer 20; a first gate electrode 15A underlying a first portion of the gate dielectric 10; a second gate electrode 15B underlying a second portion of the gate dielectric 10; a first source electrode 52 contacting a first end portion of the active layer 20; a second source electrode 52 contacting a second end portion of the active layer 20; and a drain electrode 56 contacting a middle portion of the active layer 20. The semiconductor structure may further include word lines 3 underlying the active layers 20, laterally spaced apart along a first horizontal direction hd1, and laterally extending along a second horizontal direction hd2. Each unit cell structure within the two-dimensional array of unit cell structures may include portions of a respective set of four word lines 3 selected from the word lines 3, and the respective set of four word lines 3 may include two word lines (3A or 3B) that are electrically connected to the first gate electrode 15A or to the second gate electrode 15B and two additional word lines (3B or 3A) that are electrically isolated from the first gate electrode 15A and the second gate electrode 15B.

In one embodiment, each unit cell structure within the two-dimensional array of unit cell structures may include: a first word-line-connection via structure 12 contacting a bottom surface of the first gate electrode 15A and a top surface of one of the two word lines (3A or 3B); and a second word-line-connection via structure 12 contacting a bottom surface of the second gate electrode 15B and a top surface of another of the two word lines (3A or 3B).

In one embodiment, each of the first gate electrode 15A and the second gate electrode 15B has a width along a separation direction between the first source electrode 52 and the second source electrode 52; and the width of each of the first gate electrode 15A and the second gate electrode 15B is greater than twice a width of each of the word lines 3 along the first horizontal direction hd1. This configuration ensures sufficient overlay tolerance for formation of the word-line-connection via structures 12.

In one embodiment, the separation direction between the first source electrode 52 and the second source electrode 52 is the same as the first horizontal direction hd1 (as in the first exemplary structure).

In one embodiment, the separation direction between the first source electrode 52 and the second source electrode 52 is not parallel to the first horizontal direction hd1 and is not parallel to the second horizontal direction hd2 (as in the second exemplary structure).

In one embodiment, each unit cell structure within the two-dimensional array of unit cell structures may include: a first capacitor structure 98 that includes a first source-side plate 92 that is electrically connected to the first source electrode 52; and a second capacitor structure 98 that includes a second source-side plate 92 that is electrically connected to the second source electrode 52. In one embodiment, each unit cell structure within the two-dimensional array of unit cell structures may include: a first source-side metal interconnect structure (72, 74, 82, 84) including at least one first conductive via structure (72, 82) and providing electrical connection between the first source electrode 52 and the first source-side plate 92; and a second source-side metal interconnect structure (72, 74, 82, 84) including at least one second conductive via structure (72, 82) and providing electrical connection between the second source electrode 52 and the second source-side plate 92.

In one embodiment, the semiconductor structure may include bit lines 78 laterally extending along a horizontal direction (such as the first horizontal direction hd1) that is different from the second horizontal direction hd2, wherein each unit cell structure within the two-dimensional array of unit cell structures may include a drain contact via structure 76 contacting a top surface of the drain electrode 56 and contacting a bottom surface of a respective one of the bit lines 78.

In one embodiment, the bit lines 78 laterally extend along the first horizontal direction hd1; and each of the active layers 20 has a rectangular horizontal-cross-sectional shape having first sides that are parallel to the first horizontal direction hd1 and having second sides that are parallel to the second horizontal direction hd2 (as in the first exemplary structure).

In one embodiment, the bit lines 78 laterally extend along the first horizontal direction hd1; each of the active layers 20 has a rectangular horizontal-cross-sectional shape having first sides that are not parallel to the first horizontal direction hd1 and not parallel to the second horizontal direction hd2; and the active layers within the two-dimensional array of unit cell structures are arranged with a first periodicity along a third horizontal direction hd3 that is not parallel to the first horizontal direction hd1 and not parallel to the second horizontal direction hd2 and with a second periodicity along a fourth horizontal direction hd4 that is perpendicular to the third horizontal direction hd3 (as illustrated in the second exemplary structure).

In one embodiment, the active layers 20 comprise a semiconducting metal oxide material; the substrate 8 may include a single crystalline semiconductor material layer (such as a semiconductor material layer 9); and field effect transistors 701 that includes a respective portion of the single crystalline semiconductor material layer as a respective channel region are located on the substrate 8 and underlie the two-dimensional array of unit cell structures.

According to another aspect of the present disclosure, a semiconductor structure is provided, which may include: an active layer 20 that includes a semiconductor material and overlying a substrate 8; a gate dielectric 10 underlying the active layer 20; a first gate electrode 15A underlying a first portion of the gate dielectric 10; a second gate electrode 15B underlying a second portion of the gate dielectric 10 and laterally spaced apart from the first gate electrode 15A; a first source electrode 52 contacting a first end portion of the active layer 20; a second source electrode 52 contacting a second end portion of the active layer 20; a drain electrode 56 contacting a middle portion of the active layer 20; and at least four word lines 3 having an areal overlap with the active layer 20 in a plan view and underlying the active layer 20, wherein a first word line (3A or 3B) selected from the at least four word lines 3 is electrically connected to the first gate electrode 15A, a second word line (3A or 3B) selected from the at least four word lines 3 is electrically connected to the second gate electrode 15B, and all word lines 3 selected from the at least four word lines 3 other than the first word line (3A or 3B) and the second word line (3A or 3B) are electrically isolated from the first gate electrode 15A and the second gate electrode 15B.

In one embodiment, the semiconductor structure may include: a drain contact via structure 76 contacting a top surface of the drain electrode 56; and a bit line 78 contacting the drain contact via structure 76 and laterally extending over the first source electrode 52 and the second source electrode 52.

In one embodiment, the semiconductor structure may include: a first capacitor structure 98 that includes a first source-side plate 92 that is electrically connected to the first source electrode 52; and a second capacitor structure 98 that includes a second source-side plate 92 that is electrically connected to the second source electrode 52.

In one embodiment, the semiconductor structure may include: a first source-side metal interconnect structure (72, 74, 82, 84) that includes at least one first conductive via structure (72, 82) and providing electrical connection between the first source electrode 52 and the first source-side plate 92; a second source-side metal interconnect structure (72, 74, 82, 84) that includes at least one second conductive via structure (72, 82) and providing electrical connection between the second source electrode 52 and the second source-side plate 92; and a field effect transistor 701 underlying the at least four word lines 3 and that includes a respective portion of the substrate 8 as a respective channel region.

In one embodiment, the semiconductor structure may include a sense amplifier SA that includes field effect transistors 701 and having an input node that is electrically connected to the bit line 78. The field effect transistors 701 may be located on the substrate 8 and may include a respective channel region containing a single crystalline semiconductor material. The channel regions may be portions of a single crystalline semiconductor material of a semiconductor material layer 9 within the substrate, or may comprise a same single crystalline material as the single crystalline semiconductor material of a semiconductor material layer 9 within the substrate 8 (as in embodiments that use gate-all-around field effect transistors).

Generally, it is difficult to scale down semiconductor devices or to embed additional devices in advanced nodes. For example, it is difficult to scale and embed DRAM devices in sub-20 nm device nodes. Folded bit line architecture may effectively improve signal-to-noise ratio, but comes with area penalty and sometimes with design-rule-violating routing style when put into standard logic process The structures and methods of the present disclosure uses transistors, such as BEOL thin film transistors (TFT's), as access transistors for DRAM capacitor structures, and is compatible with a CMOS-under-Array (CuA) configuration, i.e., a configuration in which field effect transistors using single crystalline channels are provided within a memory array. The folded bit line architecture may be used for the DRAM array of the present disclosure without area penalty.

The compact common-drain configuration in which a pair of thin film transistors share a drain electrode may be used to provide an area-efficient layout on par with SRAM arrays in terms of area efficiency in advanced nodes. Optionally, jumper routing and/or slanted, asymmetric pair designs may be used to further reduce unit device area while using the folded bit line architecture that provides a high signal-to-noise ratio.

The structures and methods of the present disclosure provide an all-BEOL 1T1C DRAM array that is compatible with the CMOS-under-Array (CuA) configuration to minimize use of FEOL device area. The BEOL DRAM array of the present disclosure may be vertically stacked to provide multiple levels of BEOL DRAM arrays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a two-dimensional array of layer stacks, wherein each of the layer stacks comprises a respective active layer comprising a semiconductor material and having a uniform active layer thickness throughout and a respective gate dielectric having a uniform gate dielectric thickness throughout and having a same area as the respective active layer, wherein an entirety of a bottom surface of the respective active layer is in direct contact with an entirety of a top surface of the respective gate dielectric;
 a one-dimensional array of word lines that underlie the two-dimensional array of layer stacks and located below, and vertically spaced from, a horizontal plane including bottom surface of the gate dielectrics, wherein the word lines comprise a laterally alternating sequence of first word lines and second word lines that alternating along a first horizontal direction, and each of the word lines laterally extend along a second horizontal direction that is perpendicular to the first horizontal direction;
 a one-dimensional array of bit line that overlie the two-dimensional array of layer stacks and laterally extending along the first horizontal direction;
 a two-dimensional array of first gate electrodes, wherein each of the first gate electrodes underlies a first portion of a respective one of the gate dielectrics; and
 a two-dimensional array of second gate electrodes, wherein each of the gate dielectrics comprises a bottom surface having a first portion that contacts a respective one of the first gate electrodes and having a second portion that contacts a respective one of the second gate electrodes.

2. The semiconductor structure of claim 1, further comprising a two-dimensional array of word-line-connection via structures, wherein each word-line-connection via structure within a first subset of the word-line-connection via structure contacts a bottom surface of a respective first gate electrode among the first gate electrodes and contacts a top surface of a respective first word line among the first word lines, and a second subset of the word-line-connection via structure contacts a bottom surface of a respective second gate electrode among the second gate electrodes and contacts a top surface of a respective second word line among the second word lines.

3. The semiconductor structure of claim 1, further comprising:
 a two-dimensional array of first source electrodes;
 a two-dimensional array of second source electrodes; and
 a two-dimensional array of drain electrodes, wherein each of the active regions comprises a top surface having a first end portion that contacts a respective one of the first source electrodes, a second end portion that contacts a respective one of the second source electrodes, and a middle portion that contacts a respective one of the drain electrodes.

4. The semiconductor structure of claim 3, further comprising a two-dimensional array of drain contact via structures contacting a top surface of a respective one of the drain regions, wherein each of the bit lines contacts top surfaces of a respective row of drain contact via structures that are arranged along the bit line direction.

5. The semiconductor structure of claim 4, further comprising a two-dimensional array of source contact via structures, wherein a first subset of the source contact via structures contacts top surfaces of the first source electrodes, and a second subset of the source contact via structures contacts top surface of the second source electrodes, and each of the source contact via structures comprises a respective straight sidewall that vertically extends from a horizontal plane including top surface of the first source electrodes and the second source electrodes to another horizontal plane that overlies top surfaces of the bit lines.

6. The semiconductor structure of claim 5, wherein:
 the two-dimensional array of source contact via structures comprises multiple rows of source contact via structures such that each row of source contact via structures comprises a respective subset of the source contact via structures that are aligned along the first horizontal direction with a uniform periodicity along the first horizontal direction; and
 each active layer within the two-dimensional array of layer stacks has an areal overlap with two source contact via structures located within a respective neighboring row of source contact via structures.

7. The semiconductor structure of claim 6, wherein a pair of bit lines among the one-dimensional array of bit line is located between the respective neighboring row of source contact via structures in a plan view.

8. The semiconductor structure of claim 3, further comprising a thin-film-transistor-level (TFT-level) dielectric layer embedding the two-dimensional array of layer stacks, the two-dimensional array of first source electrodes, the two-dimensional array of second source electrodes, and the two-dimensional array of drain electrodes, wherein top surfaces of the first source electrodes, top surfaces of the second source electrodes, and top surfaces of the drain electrodes are located entirety within a horizontal plane including a top surface of the TFT-level dielectric layer.

9. The semiconductor structure of claim 8, wherein each of the layer stacks has a bottommost planar surface located entirely within a horizontal plane including a bottom surface of the TFT-level dielectric layer.

10. The semiconductor structure of claim 1, wherein:
each of the first gate electrodes and the second gate electrodes has a width along the first horizontal direction; and
the width of each of the first gate electrodes and the second gate electrodes is greater than twice a width of each of the word lines along the first horizontal direction.

11. The semiconductor structure of claim 1, wherein the respective active layer consists of a semiconducting metal oxide material having a uniform material composition throughout.

12. The semiconductor structure of claim 1, wherein:
each of the active layers has a rectangular horizontal-cross-sectional shape having first sides that are not parallel to the first horizontal direction and not parallel to the second horizontal direction; and
the active layers within the two-dimensional array of layer stacks are arranged with a first periodicity along a third horizontal direction that is not parallel to the first horizontal direction and not parallel to the second horizontal direction and with a second periodicity along a fourth horizontal direction that is perpendicular to the third horizontal direction.

13. A semiconductor structure comprising:
a two-dimensional array of layer stacks, wherein each of the layer stacks comprises a respective active layer comprising a semiconductor material and having a uniform active layer thickness throughout and a respective gate dielectric having a uniform gate dielectric thickness throughout and having a same area as the respective active layer, an entirety of a bottom surface of the respective active layer is in direct contact with an entirety of a top surface of the respective gate dielectric;
a one-dimensional array of word lines that underlie the two-dimensional array of layer stacks and located below, and vertically spaced from, a horizontal plane including bottom surface of the gate dielectrics, wherein the word lines comprise a laterally alternating sequence of first word lines and second word lines that alternating along a first horizontal direction, and each of the word lines laterally extend along a second horizontal direction that is perpendicular to the first horizontal direction;
a one-dimensional array of bit line that overlie the two-dimensional array of layer stacks and laterally extending along the first horizontal direction;
a two-dimensional array of first gate electrodes, wherein each of the first gate electrodes underlies a first portion of a respective one of the gate dielectrics; and
a two-dimensional array of second gate electrodes, wherein each of the gate dielectrics comprises a bottom surface having a first portion that contacts a respective one of the first gate electrodes and having a second portion that contacts a respective one of the second gate electrodes, wherein each of the active layers has a respective rectangular shape in a top-down view, and all sides of the respective rectangular shape are not parallel to the first horizontal direction and are not parallel to the second horizontal direction.

14. The semiconductor structure of claim 13, wherein the respective active layer consists of a semiconducting metal oxide material having a uniform material composition throughout.

15. The semiconductor structure of claim 13, further comprising a thin-film-transistor-level (TFT-level) dielectric layer embedding the two-dimensional array of layer stacks, the two-dimensional array of first source electrodes, the two-dimensional array of second source electrodes, and the two-dimensional array of drain electrodes, wherein top surfaces of the first source electrodes, top surfaces of the second source electrodes, and top surfaces of the drain electrodes are located entirety within a horizontal plane including a top surface of the TFT-level dielectric layer.

16. The semiconductor structure of claim 15, wherein each of the layer stacks has a bottommost planar surface located entirely within a horizontal plane including a bottom surface of the TFT-level dielectric layer.

17. A semiconductor structure comprising:
a two-dimensional array of layer stacks, wherein each of the layer stacks comprises a respective active layer comprising a semiconductor material and having a uniform active layer thickness throughout and a respective gate dielectric having a uniform gate dielectric thickness throughout and having a same area as the respective active layer, wherein an entirety of a bottom surface of the respective active layer is in direct contact with an entirety of a top surface of the respective gate dielectric;
a one-dimensional array of word lines that underlie the two-dimensional array of layer stacks and located below, and vertically spaced from, a horizontal plane including bottom surface of the gate dielectrics, wherein the word lines comprise a laterally alternating sequence of first word lines and second word lines that alternating along a first horizontal direction, and each of the word lines laterally extend along a second horizontal direction that is perpendicular to the first horizontal direction;
a one-dimensional array of bit line that overlie the two-dimensional array of layer stacks and laterally extending along the first horizontal direction;
a two-dimensional array of first gate electrodes, wherein each of the first gate electrodes underlies a first portion of a respective one of the gate dielectrics;
a two-dimensional array of second gate electrodes, wherein each of the gate dielectrics contacts a respective one of the first gate electrodes and a respective one of the second gate electrodes;
a two-dimensional array of first source electrodes;
a two-dimensional array of second source electrodes; and
a two-dimensional array of drain electrodes, wherein each of the active regions comprises a top surface having a first end portion that contacts a respective one of the first source electrodes, a second end portion that contacts a respective one of the second source electrodes, and a middle portion that contacts a respective one of the drain electrodes.

18. The semiconductor structure of claim 17, further comprising a two-dimensional array of word-line-connection via structures, wherein each word-line-connection via structure within a first subset of the word-line-connection via structure contacts a bottom surface of a respective first gate electrode among the first gate electrodes and contacts a top surface of a respective first word line among the first word lines, and a second subset of the word-line-connection via structure contacts a bottom surface of a respective second gate electrode among the second gate electrodes and contacts a top surface of a respective second word line among the second word lines.

19. The semiconductor structure of claim 17, further comprising a two-dimensional array of source contact via structures, wherein a first subset of the source contact via structures contacts top surfaces of the first source electrodes, and a second subset of the source contact via structures contacts top surface of the second source electrodes, and each of the source contact via structures comprises a respective straight sidewall that vertically extends from a horizontal plane including top surface of the first source electrodes and the second source electrodes to another horizontal plane that overlies top surfaces of the bit lines.

20. The semiconductor structure of claim 19, wherein:
the two-dimensional array of source contact via structures comprises multiple rows of source contact via structures such that each row of source contact via structures comprises a respective subset of the source contact via structures that are aligned along the first horizontal direction with a uniform periodicity along the first horizontal direction;
each active layer within the two-dimensional array of layer stacks has an areal overlap with two source contact via structures located within a respective neighboring row of source contact via structures; and
each active layer within the two-dimensional array of layer stacks has an areal overlap with a respective pair of bit lines within the one-dimensional array of bit line, and is electrically connected a bit line within the respective pair of bit lines, and is electrically isolated from an additional bit line within the respective pair of bit lines.

* * * * *